(12) United States Patent
Irving et al.

(10) Patent No.: US 8,129,098 B2
(45) Date of Patent: Mar. 6, 2012

(54) COLORED MASK COMBINED WITH SELECTIVE AREA DEPOSITION

(75) Inventors: Lyn M. Irving, Rochester, NY (US); Diane C. Freeman, Pittsford, NY (US); Peter J. Cowdery-Corvan, Webster, NY (US); Cheng Yang, Pittsford, NY (US); David H. Levy, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 1141 days.

(21) Appl. No.: 11/986,169

(22) Filed: Nov. 20, 2007

(65) Prior Publication Data

US 2009/0130609 A1    May 21, 2009

(51) Int. Cl.
    *G03F 7/20* (2006.01)
(52) U.S. Cl. ......................... 430/324; 430/396
(58) Field of Classification Search .................. None
    See application file for complete search history.

(56) References Cited

U.S. PATENT DOCUMENTS

| | | | |
|---|---|---|---|
| 4,174,219 A | 11/1979 | Andres et al. | |
| 4,345,011 A | 8/1982 | Drexhage | |
| 5,262,893 A * | 11/1993 | Shrauger et al. | 359/565 |
| 5,391,507 A | 2/1995 | Kwasnick et al. | |
| 6,338,988 B1 | 1/2002 | Andry et al. | |
| 7,056,834 B2 | 6/2006 | Mei et al. | |
| 7,100,510 B2 | 9/2006 | Brost et al. | |
| 7,160,819 B2 | 1/2007 | Conley, Jr. et al. | |
| 2002/0001777 A1 | 1/2002 | Kido | |
| 2004/0070705 A1 | 4/2004 | Kobayashi | |
| 2004/0229411 A1 | 11/2004 | Battersby | |
| 2006/0063351 A1 * | 3/2006 | Jain | 438/455 |
| 2007/0269750 A1 * | 11/2007 | Irving et al. | 430/322 |
| 2009/0280243 A1 * | 11/2009 | Mayer et al. | 427/154 |

FOREIGN PATENT DOCUMENTS

FR    2595155    2/1986

OTHER PUBLICATIONS

Ashwini Sinha, et al., "Area selective atomic layer deposition of titanium dioxide: Effect of precursor chemistry," pp. 2523-2532, J. Vac. Sci. Technol. B 24(6), Nov./Dec. 2006.

* cited by examiner

Primary Examiner — John A. McPherson
(74) Attorney, Agent, or Firm — J. Lanny Tucker

(57) ABSTRACT

The invention relates to a process for forming a structure comprising (a) providing a transparent support; (b) forming a color mask on a first side of the transparent support; (c) applying a first layer comprising a deposition inhibitor material that is sensitive to visible light; (d) patterning the first layer by exposing the first layer through the color mask with visible light to form a first pattern and developing the deposition inhibitor material to provide selected areas of the first layer effectively not having the deposition inhibitor material; and (e) depositing a second layer of functional material over the transparent support; wherein the second layer of functional material is substantially deposited only in selected areas over the transparent support not having the deposition inhibitor material.

15 Claims, 16 Drawing Sheets

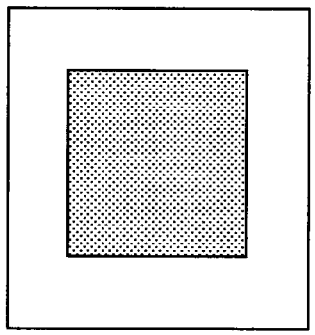 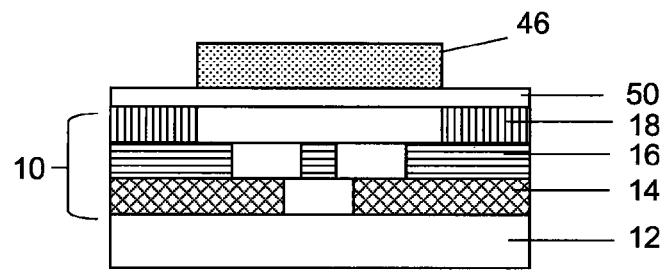
FIG. 11A  FIG. 11B
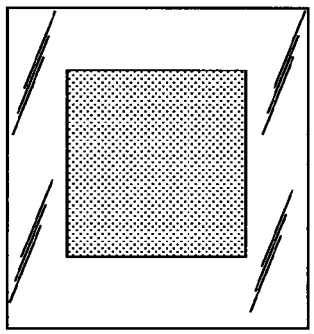 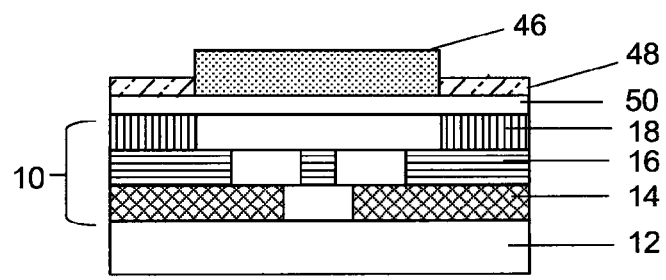
FIG. 11C  FIG. 11D
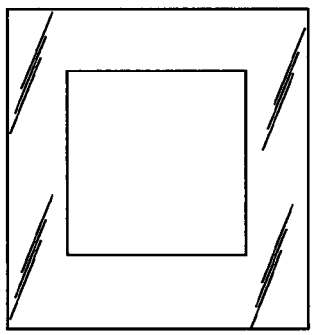 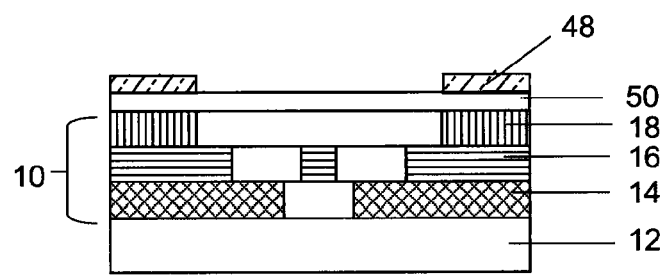
FIG. 11E  FIG. 11F

COLORED MASK COMBINED WITH SELECTIVE AREA DEPOSITION

CROSS-REFERENCE TO RELATED APPLICATIONS

Reference is made to commonly assigned U.S. application Ser. No. 11/986,155, filed concurrently by Irving et al. and entitled, "COLORED MASK FOR FORMING TRANSPARENT STRUCTUES," U.S. application Ser. No. 11/942,780, filed concurrently by Irving et al. and entitled "PHOTO-PATTERNABLE DEPOSTION INHIBITOR CONTAINING SILOXANE," U.S. application Ser. No. 11/986,102, filed concurrently by Irving et al. and entitled "MULTICOLOR MASK," U.S. application Ser. No. 11/986,068, filed concurrently by Irving et al. and entitled "INTEGRATED COLOR MASK," U.S. application Ser. No. 11/986,189, filed concurrently by Irving et al. and entitled, "GRADIENT COLORED MASK," and U.S. application Ser. No. 11/986,088, filed concurrently by Irving et al. and entitled, "MULTICOLORED MASK PROCESS FOR MAKING DISPLAY CIRCUITRY." All the above-identified applications incorporated by reference in their entirety.

FIELD OF THE INVENTION

The invention relates to a colored masking technique useful for forming electrical and optical components.

BACKGROUND OF THE INVENTION

Manufacture of many electronic components, including flat panel displays, RFID tags, and various sensing applications, relies upon accurately patterning layers of electrically active materials applied to a relatively large substrate. These products are composed of several layers of different patterned materials, where it is important that the layers be in specific registration. The reasons for patterning accuracy are twofold. First of all, patterned features must be reproduced across large areas of a substrate while having precise control over their dimensions. Secondly, products built with these features typically are composed of several layers of different, but interacting patterned layers, where it is important that the layers be in specific registration or alignment.

Traditionally, the precise layer alignment required for fabrication of electronic components and devices is accomplished using conventional photolithography. An electrically active layer and a photoresist layer are deposited on a substrate, the position of an existing pattern on the substrate is detected, and an exposure mask is aligned to that existing pattern. The photoresist is exposed, developed, and the electrically active material is etched. Small variations in temperature and humidity in this precise operation may be enough to introduce alignment errors; rigid glass substrates are used with stringent environmental controls to reduce these variations. At the other extreme, conventional printing techniques such as offset lithography, flexography, and gravure printing also apply multiple layers at extremely high speeds, although at substantially lower overlay accuracy.

There is a growing interest in advancing printing technology toward fabrication of thin film electrical components (such as TFTs) on flexible or plastic substrates. These substrates would be mechanically robust, lighter weight, and eventually lead to lower cost manufacturing by enabling roll-to-roll processing. In spite of the potential advantages of flexible substrates, there are many issues affecting the performance and ability to perform alignments of transistor components across typical substrate widths up to one meter or more. In particular, for example, the overlay accuracy achievable using traditional photolithography equipment can be seriously impacted by substitution of a flexible plastic substrate for the rigid glass substrates traditionally employed. Dimensional stability, particularly as the process temperature approaches the glass transition temperature (Tg) of supports, water and solvent swelling, anisotropic distortion, and stress relaxation are all key parameters in which plastic supports are inferior to glass.

Typical fabrication involves sequential deposition and patterning steps. Three types of registration errors are common in these fabrication processes: fixed errors, scale errors, and local misalignments. The fixed error, which refers to a uniform shift of one pattern to another, is typically dominated by the details of the motion control system. Specifically, mechanical tolerances and details of the system integration ultimately dictate how accurately the substrate may be aligned to a mask, or how accurately an integrated print device may be positioned with respect to a registration mark on a moving web. In addition to fixed errors, scale errors may also be substantial. Errors in pattern scale are cumulative across the substrate and arise from support dimensional change, thermal expansion, and angular placement errors of the substrate with the patterning device. Although the motion control system impacts angular placement, pattern scale mismatch is largely driven by the characteristics of the support. Thermal expansion, expansion from humidity or solvent exposure, shrinkage from high temperature exposure, and stress relaxation (creep) during storage of the support all contribute to pattern scale errors. Further, local pattern mismatch arising from nonisotropic deformations may also occur, particularly since the conveyance process involves applying tension. A flexible support used in roll-to-roll manufacturing will typically stretch in the conveyance direction and narrow in width.

There are several approaches to address the registration problem for fabrication of electronics on flexible substrates, but at this point a leading methodology has yet to emerge. Attach/detach technology has been explored by French et al, wherein a flexible substrate is laminated to a rigid carrier and runs through a traditional photolithographic process (I. French et al., "Flexible Displays and Electronics Made in AM-LCD Facilities by the EPLaRTM Process" SID 07 Digest, pp. 1680-1683 (2007)). Unfortunately, these technologies ultimately produce a flexible electronics component only with the cost structure of current glass based processing. US Patent Publication No. 2006/0063351 by Jain describes coating the front side and back side of a substrate with one or more resist layers that may be activated simultaneously to impart distinct pattern images within each resist layer. The precoated substrate is inserted between a set of prealigned masks, or alternatively a dual wavelength maskless direct laser writing lithography system is used, to simultaneously expose the front and back sides. Active alignment systems to detect previously existing patterns and compensation schemes for deformation have also been suggested in U.S. Pat. No. 7,100,510, by Brost et al. With this approach, instead of attaining accurate pattern overlay by maintaining tight specs on support dimensional stability and strict environmental control, the motion control system performs multiple alignments per substrate to compensate for distortion. The proposed solution of Brost et al., to adapt traditional printing equipment for active alignment, may be viewed as exchanging the lens, mask, and lamp of a modem stepper with an integrated print device. It is difficult to imagine significant equipment cost difference or throughput advantage, particularly if the added task of distortion compensation is included. A fabrication cost advantage would likely come primarily from materials usage savings or removal of expensive vacuum deposition steps.

Another approach, which would potentially enable high speed processing with low capital investment, is to employ a self-aligning fabrication process. In a self-aligning process, a template for the most critical alignments in the desired structure is applied in one step to the substrate and from that point forward alignment of subsequent layers is automatic. Various methods have been described for fabricating self-aligned TFTs. Most of these methods allow self alignment of one layer to another layer, but do not significantly remove the need for very sophisticated alignment steps between several layers. For example, the gate electrode in some a-Si TFT processes is used as a "mask" to protect the channel area from doping and laser annealing of the silicon on either side of the channel region. The concept of self-aligned fabrication can be understood from U.S. Pat. No. 5,391,507 by Kwasnick et al., U.S. Pat. No. 6,338,988 byo Andry et al., and US Patent Publication No. 2004/229411 by Battersby.

One published technique offering the potential for a fully self aligned process that eliminates the need for complex registration is Self-Aligned Imprint Lithography (SAIL), as illustrated in U.S. Pat. No. 7,056,834 by Mei et al. In imprint lithography, a variable-thickness resist is prepared on the electronically active layers and a sequencing of chemical etch and materials deposition is matched to controlled erosion of the photoresist to produce TFT structures. There are difficulties with the SAIL process, however. First, robust nanoimprint technology is necessary for webs. Second, the SAIL process requires high accuracy etch depth control, which may not be consistent with a low cost process. Finally, a significant limitation of the SAIL process is that layers produced by the mask cannot be fully independent. As an example, it is particularly challenging to form openings under continuous layers with this approach, an essential element in a matrix backplane design.

There is also interest in utilizing lower cost processes for materials deposition that do not involve the expense associated with vacuum processing and subtractive patterning processes. In typical vacuum depositions, a large metal chamber and sophisticated vacuum pumping systems are required in order to provide the necessary environment. In typical subtractive patterning systems, much of the material deposited in the vacuum chamber is removed, for example in an etch step. These deposition and subtractive patterning methods have high capital costs and preclude the easy use of continuous web-based systems.

It would be desirable to combine materials deposition and patterning employing selective area deposition, or SAD. As the name implies, selective area deposition involves treating portion(s) of a substrate such that a material is deposited only in those areas that are desired, or selected. In this approach, a deposition process employing either liquid or vapor phase chemical delivery would be tailored to operate in a manner where material selectively deposits only in certain areas.

Atomic layer deposition ("ALD") is an example of a film deposition technology that potentially can be used as a fabrication step for forming a number of types of thin-film electronic devices and components, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors. One approach to combining patterning and depositing a semiconductor by ALD is shown in U.S. Pat. No. 7,160,819 by Conley, Jr. et al. Conley, Jr. et al. discuss materials for use in patterning Zinc Oxide on silicon wafers. No information is provided on the use of other substrates, or the results for other metal oxides. Sinha et al. (J. Vac. Sci. Technol. B 24 6 2523-2532 (2006)), have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or surface modified in such a way that the film is deposited only on the activated areas.

A number of materials have been used by researchers as director inhibitor compounds for selective area deposition. Sinha et al., referenced above, use poly(methyl methacrylate (PMMA) in their masking layer. Conley, Jr. et al. employed acetone and deionized water, along with other process contaminants as deposition inhibitor materials. The problem with these previously used director inhibitors is that they are only effective to direct selected thin materials. Additionally, in order to be useful in constructing devices, director inhibitor compounds need to be patterned. Additive methods of patterning director inhibitors, such as lithography or inkjet are limited in their resolution. Also, there remains a difficulty in aligning the different layers in a final device that cannot be resolved by selected area deposition alone.

Therefore, there is a need for a director inhibitor compound that can work with a range of thin film materials, is easily patterned, and is suited to highly accurate patterning in a simple way. The present invention facilitates highly accurate patterning in a simple way, and solves one or more of the aforesaid problems.

PROBLEM TO BE SOLVED BY THE INVENTION

The problems addressed by the current invention are to reproduce patterned features across large areas while having precise control over the feature dimensions and the registration and alignment patterned features that are in different layers. Additionally, it is highly desirable to overcome these problems in a way that does not require expensive equipment or expensive processes.

SUMMARY OF THE INVENTION

The invention generally is accomplished by a process for forming a structure comprising:
  a) providing a transparent support;
  b) forming a color mask, having a color pattern, on a first side of the transparent support;
  c) applying a first layer comprising a deposition inhibitor material that is sensitive to visible light either on the first side or a side opposite the first side of the transparent support after forming the color mask;
  d) patterning the first layer comprising the deposition inhibitor material by exposing the first layer through the color mask with visible light to form a first pattern, wherein the first pattern is composed of deposition inhibitor material in a second exposed state that is different from a first as-coated state, and developing the deposition inhibitor material to provide selected areas of the first layer effectively not having the deposition inhibitor material; and
  e) depositing a second layer of functional material over the transparent support;

wherein the second layer of functional material is substantially deposited only in selected areas over the transparent support not having the deposition inhibitor material.

ADVANTAGEOUS EFFECT OF THE INVENTION

One advantage of the present invention is that it provides a method for forming aligned layers without the need for expensive alignment equipment and processes. A further advantage of the present invention is that it provides a method for additive patterning of inorganic thin films in a selective area deposition process. There are many potential advantages to selective area deposition techniques, such as eliminating an etch process for film patterning, reducing the number of cleaning steps required, patterning materials that are difficult to etch, and patterning layered structures that are difficult to etch selectively. Another advantage is that a multicolor mask can be used to enable automatic alignment of layers, which multicolor mask can be prepared directly on the support in color-encoded form ensuring that the correct mask is used. Additionally, deposition inhibitor materials that are patterned using a visible light exposure as proposed can be used to pattern all layers of a transistor structure directly on a color mask, for example a transistor comprising a transparent oxide semiconductor such as materials based on zinc oxide. The multicolor mask has the advantage of containing more independently addressable levels than a grayscale mask and works particularly well for patterning transparent electronic materials.

BRIEF DESCRIPTION OF THE DRAWINGS

The above and other objects, features, and advantages of the present invention will become more apparent when taken in conjunction with the following description and schematic drawings wherein identical reference numerals have been used, where possible, to designate identical or analogous features that are common to the figures, and wherein:

FIGS. 11A-11F show a selective deposition patterning process using a multicolor mask;

DETAILED DESCRIPTION OF THE INVENTION

Figure 1:
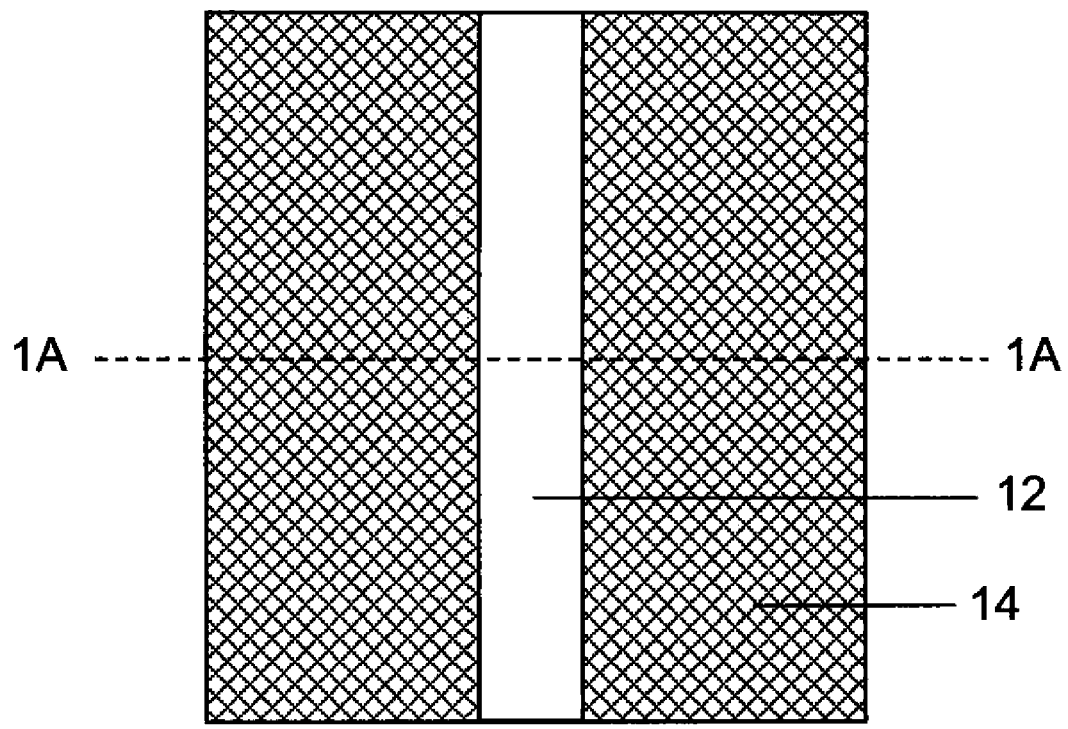
FIGS. 1 and 1A show a pattern of blue color absorber on a transparent support.

For ease of understanding, the following terms used herein are described below in more detail.

As utilized herein, the term "front" as applied to the invention article is the side of the support carrying the functional patterned layers. The term "back" as used herein refers to the side of the support opposite to the side carrying the patterned functional layers.

"Vertical" means substantially perpendicular to the surface of a substrate.

"Transparent" generally denotes a material or construct that does not absorb a substantial amount of light in the visible portion (and/or infrared portion in certain variants) of the electromagnetic spectrum. In this invention, the transparency of a materials is only with reference to the colors of light that are being used in a particular process step. Transparent means at least 65% of the reference light passes through the member.

"Photopatternable" refers to a material that, upon exposure to light, changes in states, for example, in terms of solubility, tackiness, mechanical strength, permeability to etchants or gases, surface reactivity and/or index of refraction, which allows subsequent photopatterning of the material, for example by development and removal of areas of the applied material based on the photopatterning.

"Positive" refers to a pattern, which contains material in those areas above the colored parts of the photomask.

"Negative" refers to a pattern, which contains material in those areas above the transparent parts of the photomask.

"Multicolor mask" refers to the vertically aligned set of color absorbing layers in the patterned structure. The color patterns of a multicolor mask may be in separate layers or in the same layer.

A thin film transistor (TFT) is a likely electronic element that can benefit from the patterning process of this invention. The next three definitions refer specifically to thin film transistors.

As used herein, the terms "over," "above," and "under" and the like, with respect to layers in the thin film transistor, refer to the order of the layers with respect to the support, but do not necessarily indicate that the layers are immediately adjacent or that there are no intermediate layers.

"Gate" generally refers to the insulated gate terminal of a three terminal FET when used in the context of a transistor circuit configuration.

The preceding term descriptions are provided solely to aid the reader, and should not be construed to have a scope less than that understood by a person of ordinary skill in the art or as limiting the scope of the appended claims.

The phrase "deposition inhibitor material" refers herein to the material applied to the substrate as well as the material resulting from any optionally subsequent crosslinking or other reaction that modifies the material that may occur prior to depositing an inorganic thin film on the substrate. Preferably, a polymeric photopatternable deposition inhibitor material may be crosslinked after applying the polymer onto the substrate via exposure to visible light.

The process of this invention can be used to generate any variety of multilayer structures containing patterned layers with fixed vertical registration. This process is therefore capable of producing monolithically integrated structures that can be designed to function as conductors, inductors, capacitors, transistors, diodes, photodiodes, light emitting diodes, and other electronic or optoelectronic components. Furthermore, the patterning technology can be used to simultaneously produce a number of these devices arranged in a way to produce useful electronic circuitry.

In one embodiment, accurate pattern overlay over large areas and on flexible supports is enabled by use of a color-encoded mask, a multicolored mask which is prepared directly on the support, in combination with spectrally sensitized photopatternable layers. The color-encoded mask contains either in one structure, or in multiple portions, all or most of the patterning information for the system. Transparent electronic materials are subsequently deposited in layer-by-layer fashion. Spectrally sensitized photopatternable layers are selectively exposed through the multicolored mask to form photopatterns on the front side of the support, vertically aligned to the color mask. Patterning of at least one electrically active layer is accomplished by using a selective deposition process. If desired, other photopatternable layers formed by exposure through the multicolor mask may be used to pattern electrically active layers using etch or liftoff processes. The multicolor mask can be attached to the transparent support and can be formed on either side of the support or portions thereof on both sides of the support. In one embodiment, the mask can be formed only on the same side of the support as the active layers. The multicolor mask can contain pattern information for all of the layers in a process. Fabrication using the present invention can be fully self-aligning, and catastrophic overlay errors arising from dimensional change of supports, web weave, and transport errors can be avoided.

In one embodiment of the present invention, the entire multicolor mask remains as part of the final device. In another embodiment of the invention, only a first portion of the multicolor mask remains in the final device. These embodiments will be better understood with respect to the figures.

The figures and following description illustrate a masking scheme of the current invention. The illustrative example of this description utilizes three masking layers, composed of different color absorbing materials, and utilizes photopatternable materials, sensitive to colored light, to pattern transparent functional layers. The figures are intended to illustrate the present invention and should not be considered limiting. Multicolor masks of two masking layers, as well as multicolor masks of greater than three masking layers are alternative embodiments of the present invention.

Light used for exposing can be panchromatic or colored. Panchromatic light refers to light that has some spectral intensity over the visible spectrum. Panchromatic light should be recognized by one skilled in the art as light is a light that contains multiple colors. Colored light generally refers to light that has high intensity in certain spectral regions and lower intensities in others. Colored light can be described by the wavelength of the maximum intensity ($\lambda_{max}$) and by the FWHM (full width at half the maximum), or by the bandpass.

As mentioned above, the present process involves applying a first layer comprising a deposition inhibitor material that is sensitive to visible light either on the first side or a side opposite the first side of the transparent support after forming the color mask, patterning the first layer by exposing the first layer through a color mask with visible light to form a first pattern, developing the deposition inhibitor material to provide selected areas of the first layer effectively not having the deposition inhibitor material; and then applying a layer of functional material which is patterned based on the patterned first layer. However, this step may be combined with other patterning techniques for additional layers of functional materials in the overall structure.

Figure 1A:
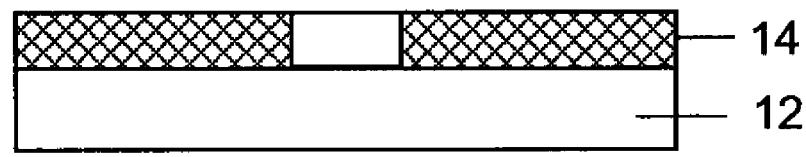
Figure 2:
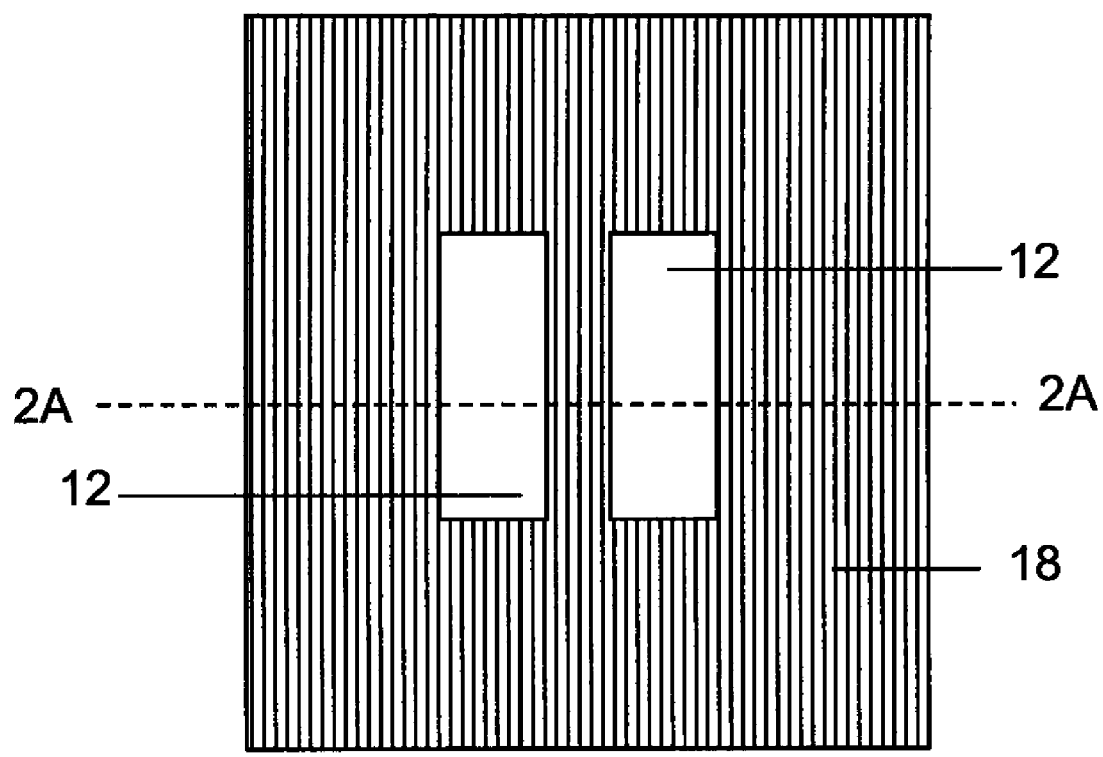
FIGS. 2 and 2A show a pattern of green color absorber on a transparent support.
Figure 2A:
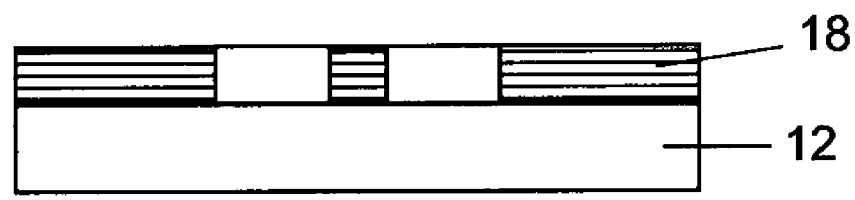
Figure 3:
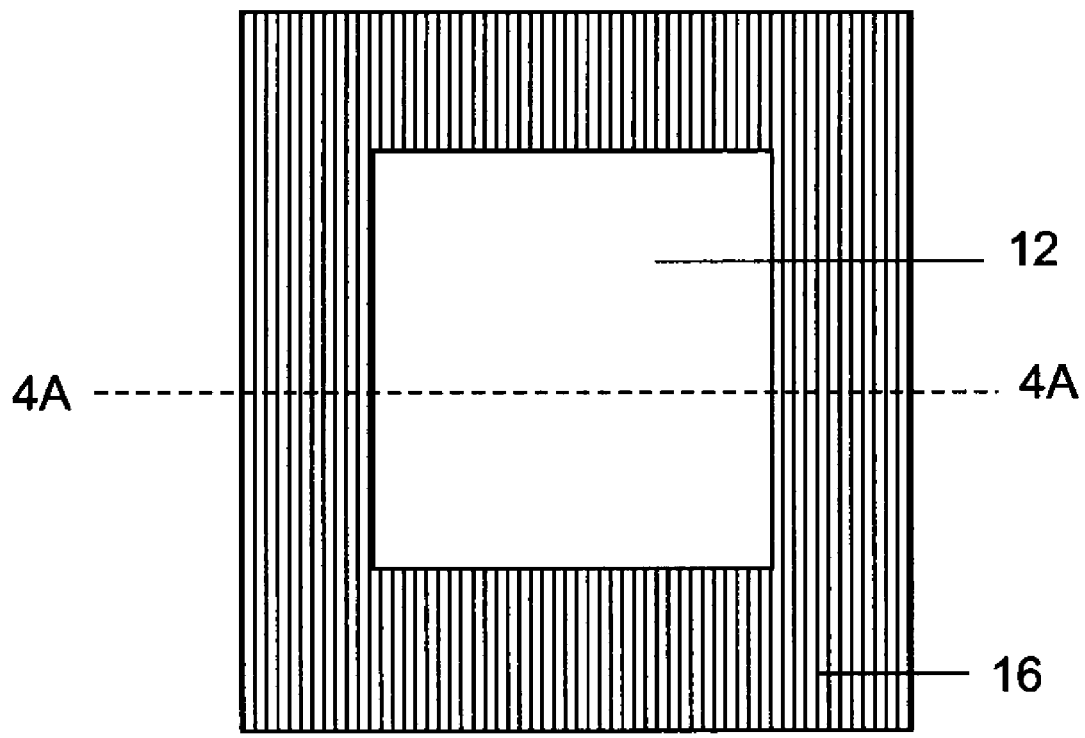
FIGS. 3 and 3A show a pattern of red color absorber on a transparent support.
Figure 3A:
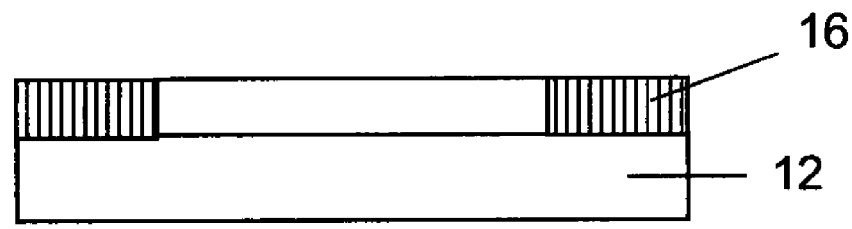
Figure 4:
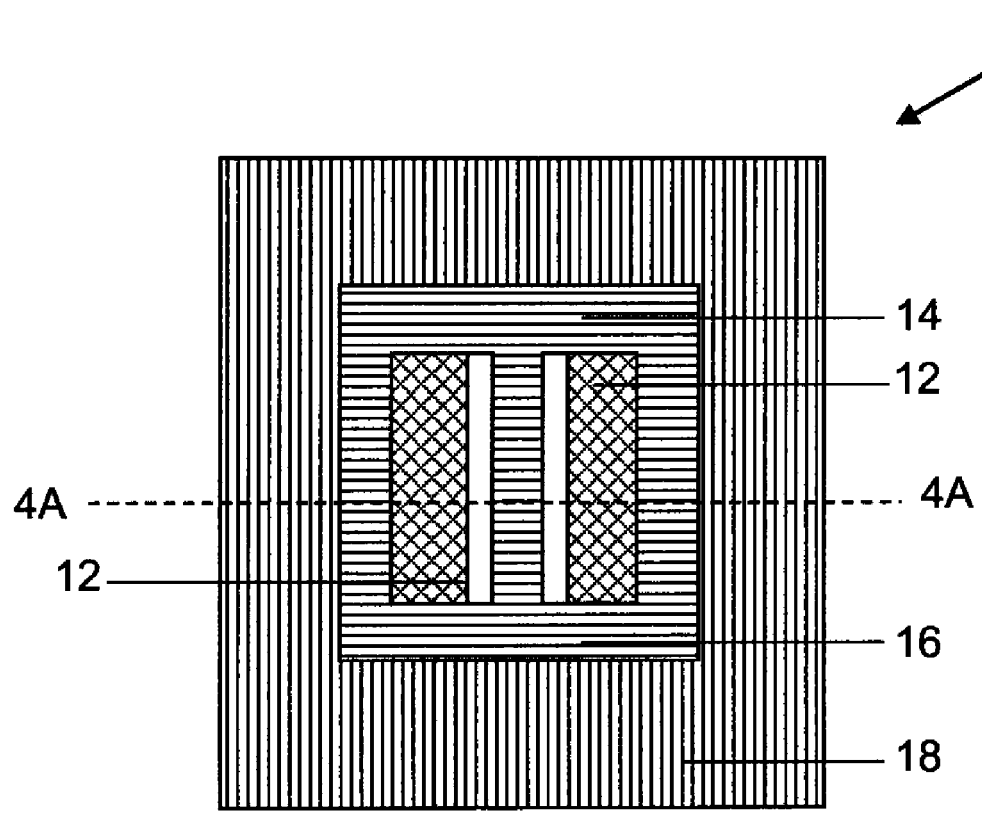
FIGS. 4 and 4A show the individual color absorber layers in a layered structure on support material forming a multicolor mask.
Figure 4A:
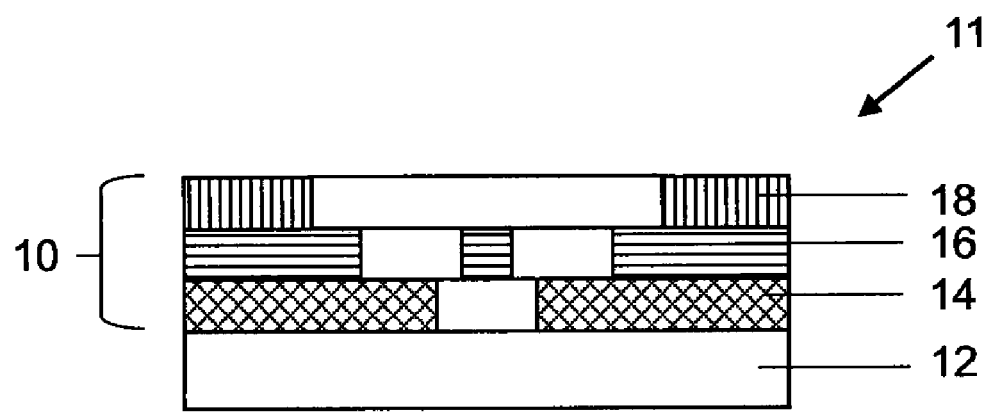

Referring now to the drawings, the embodiments of FIGS. 1-3A show the patterns of three different mask layers. FIGS. 1 and 1A show the pattern of a first mask layer as a pattern of a blue color absorber (14) on transparent support (12). FIGS. 2 and 2A show the pattern of a second mask layer as a pattern of a green color absorber (18) on transparent support (12). FIGS. 3 and 3A show the pattern of a third mask layer as a pattern of a red color absorber (16) on transparent support (12). FIGS. 4 and 4A show an article 11 composed of individual color absorber layers (14, 16, 18) in a layered structure on support material forming multicolor mask (10). An important aspect of this embodiment is that the multicolor mask contains in one structure most or all of the patterning information for the system in a color-encoded form. This is important because the entire article, including support (12) may be exposed to varying temperature, pressure, solvent and humidity treatments during the fabrication and coating steps, naturally leading to variations in dimension (such as shrinkage or thermal expansion) of the support. Web transport systems apply tension to the support, leading to dimensional instability as well. In fact, the lowest cost and potentially cheapest support materials are likely to have a higher degree of dimensional instability. For example, polyester film has a thermal expansion coefficient of 0.0018% per ° C., such that a 5° C. change can result in a dimensional change of 90 μm over 1 meter. The effect of humidity expansion and thermal expansion need not lead to cumulative and catastrophic alignment errors when a multicolor mask element (10) is provided. Simply, the patterning information is contained in the color absorbing layers that are attached to the support, and thus remain in fixed vertical alignment as the support shrinks or expands and are not impacted by support dimensional change.

FIGS. 5A-7D show processes for selectively forming patterns of photopatternable material registered with a specific color absorber pattern of multicolor mask (10). The specific pattern to be formed is selected by adjusting the sensitivity distribution of the photopatternable film. A photopatternable layer (22) with a sensitivity to blue, green, or red light is coated on the multicolor mask. This photopatternable layer is exposed with light through the multicolor mask.

The color absorbers of the multicolor mask selectively transmit the illuminating light, thereby exposing the photopatternable layer to a pattern of colored light. For example, a cyan mask absorbs red light while transmitting blue and green light. Similarly, a magenta mask absorbs green light while transmitting red and blue light and a yellow mask absorbs blue light while transmitting red and green light. Thus, by combining the properties of such individual masks, a multicolor mask may be formed to provide patterns of selectively transmitted light. The sensitivity distribution of the photopatternable layer, in a preferred embodiment, is completely contained within the absorption spectrum of one of the color absorbing materials used in multicolor mask (10) and completely isolated from the absorption spectrum of the other color absorbing materials in multicolor mask (10). In a preferred embodiment of the invention, the photopatternable layer contains a polymerizable compound and a photoinitiator responsive only to specific wavelengths of colored light. Absorption of colored light by the photoinitiator initiates the photopolymerization reaction. The photopatternable layer may contain additional components that include but are not limited to polymeric binders, fillers, pigments, surfactants, adhesion modifiers, antioxidants, co-initiators, chain transfer agents, and the like. One convenient way to modify the sensitivity distribution of the photopatternable layer is with the identity of the photoinitiator. The spectral distribution of illuminating light may be specifically selected to minimize effects from unwanted absorption of the color absorbing material and/or unwanted sensitivity of the photopatternable layer. Following exposure, the photopatternable layer is developed. The remaining pattern may be the positive image of the mask layer or the negative image of the mask layer, depending on the type of photopatternable material used.

Figure 5A:
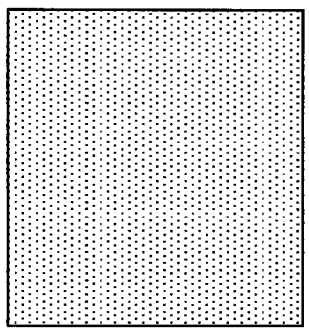
FIGS. 5A-5D show a process for selectively forming a pattern of material registered with the blue color absorber pattern of the multicolor mask.
Figure 5B:
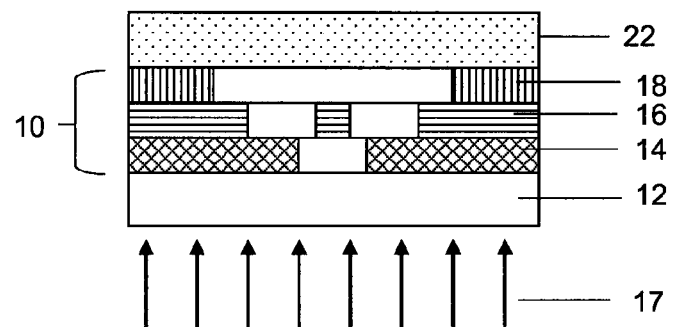
Figure 5C:
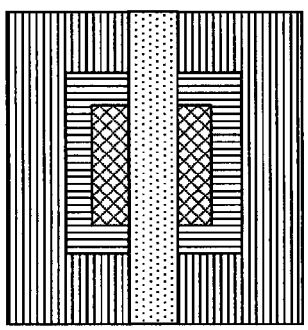
Figure 5D:
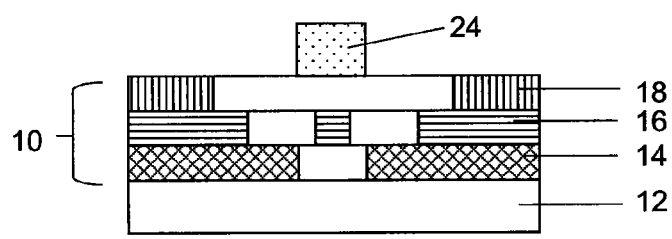

FIGS. 5A-7D illustrate the use of a photocurable or negative working photopatternable layer. FIGS. 5A-5D show a process for selectively forming a pattern of material registered with the blue color absorber pattern of the multicolor mask. Referring now to FIGS. 5A and 5B, there is illustrated a schematic plan view and cross-sectional view of the multicolor mask (10) that has been coated with a blue photopatternable layer (22) and exposed with a light source containing blue light. This light source may provide white light or panchromatic light. In this embodiment, the photopatternable material of the photopatternable layer is negative working. FIGS. 5C and 5D show the schematic plan view and cross-sectional view of the resulting structure after the exposed blue-curable film from FIG. 5A has been developed, forming a pattern of blue-cured material (24) registered with the blue color absorber pattern (14) of multicolor mask (10).

Figure 6A:
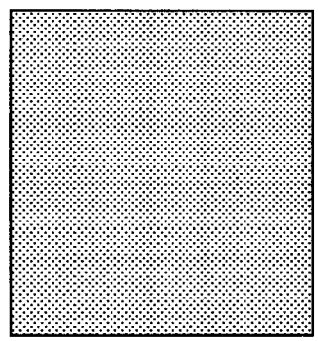
FIGS. 6A-6D show a process for selectively forming a pattern of material registered with the green color absorber pattern of the multicolor mask.
Figure 6B:
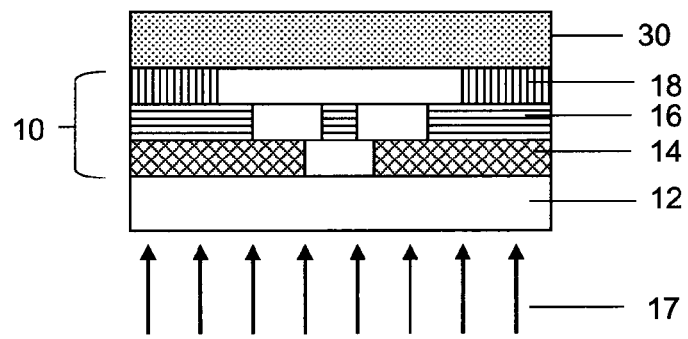

FIGS. 6A-6D show a process for selectively forming a pattern of material registered with the green color absorber pattern of the multicolor mask. FIGS. 6A and 6B show a schematic plan view and cross-sectional view of the multicolor mask (10) that has been coated with a green photopatternable layer (30) and exposed with a light source containing green light. Again, in this embodiment, the light source may provide white light or panchromatic light, and the photopatternable material of the photopatternable layer is negative working.

Figure 6C:
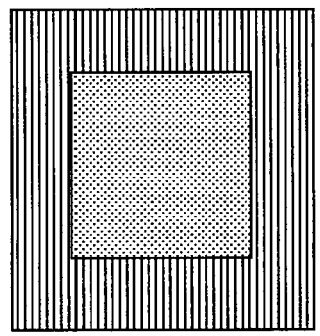
Figure 6D:
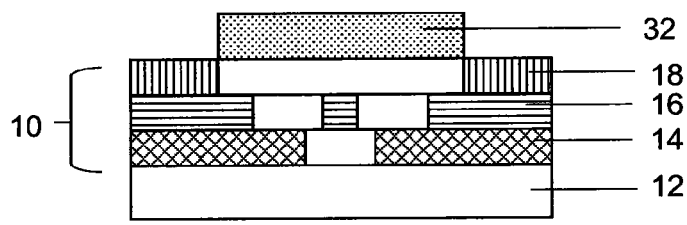

FIGS. 6C and 6D show a schematic plan view and cross-sectional view of the resulting structure after the exposed green-curable film from FIG. 6A has been developed, forming a pattern of green-cured material (32) registered with the green color absorber pattern (18) of multicolor mask (10).

Figure 7A:
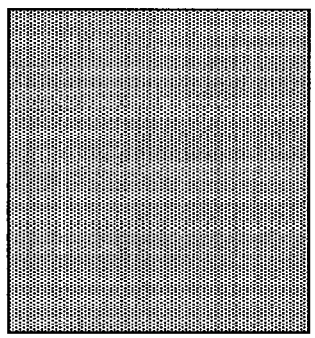
FIGS. 7A-7D show a process for selectively forming a pattern of material registered with the red color absorber pattern of the multicolor mask.
Figure 7B:
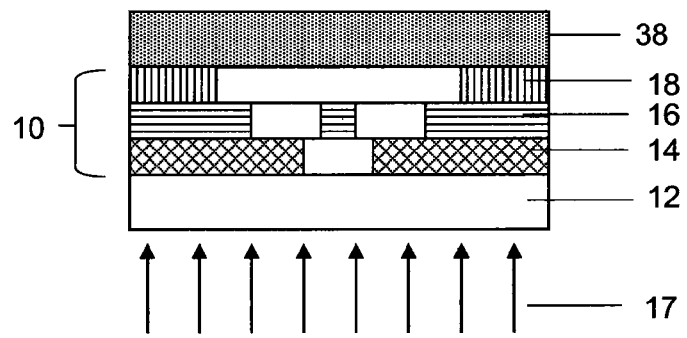

FIGS. 7A-7D show a process for selectively forming a pattern of material registered with the red color absorber pattern of the multicolor mask. FIGS. 7A and 7B show a schematic plan view and cross-sectional view of the multicolor mask (10) that has been coated with a red curable film (38) and exposed with a light source containing red light. Again, in this embodiment, the light source may provide white light or panchromatic light, and the photopatternable material of the photopatternable layer is negative working.

Figure 7C:
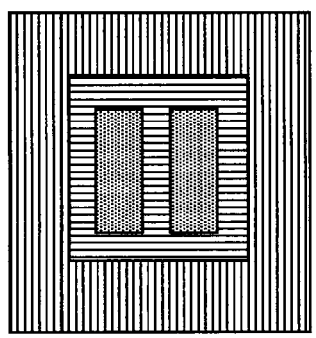
Figure 7D:
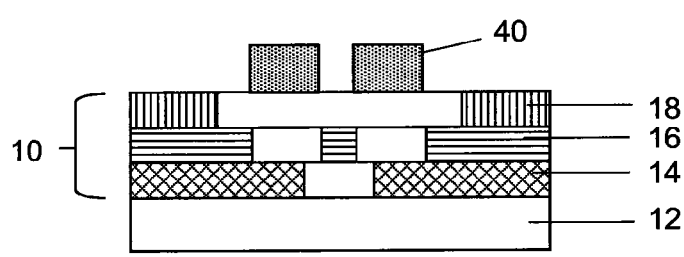

FIGS. 7C and 7D show a schematic plan view and cross-sectional view of the resulting structure after the exposed red-curable film from FIG. 7A has been developed, forming a pattern of red-cured material (40) registered with the red color absorber pattern (16) of multicolor mask (10).

FIGS. 8A-8H show a process where three different patterned structures are selectively formed by changing the color of exposing light through the multicolor mask and employing a film 44 curable with panchromatic light. A pan-curable film may be formulated, for example, which contains a polymerizable compound and a mixture of red, green, and blue responsive photoinitiators. When a pan-curable film is used with the present process, the specific pattern to be formed is selected by adjusting the spectral energy distribution of the exposing light. Therefore, the absorption spectrum of the color absorbing material for the intended pattern should match the wavelength of exposing light.

Figure 8A:
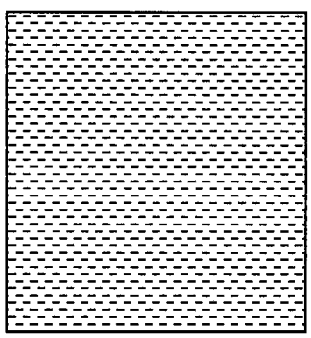
FIGS. 8A-8H show a process where three different patterned structures are selectively formed by changing the color of exposing light through the multicolor mask.
Figure 8B:
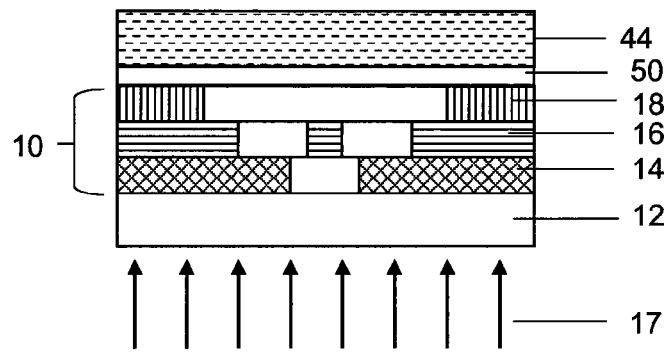

FIGS. 8A-8H also serve to illustrate another embodiment of the present invention. Multicolor mask 10 may optionally have a transparent coating 50 on the top surface. The transparent coating 50 may have insulating, smoothing, planarizing or other properties which improve the performance of the end device that will be formed over the multicolor mask 10. FIGS. 8A-8H illustrate the present invention using negative acting photopatternable materials; one skilled in the art will understand that the present invention may also be used with positive acting materials. FIGS. 8A and 8B show a schematic plan view and cross-sectional view of the multicolor mask (10), which has been coated with a film photopatternable with panchromatic light (44).

Figure 8C:
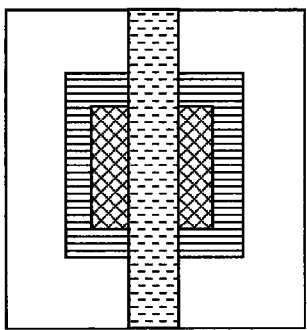
Figure 8D:
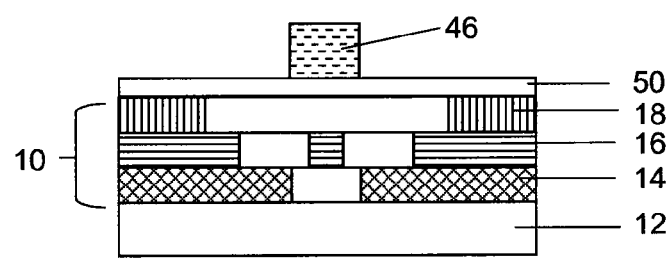

FIGS. 8C and 8D show a schematic plan view and cross-sectional view of the resulting structure after the film photopatternable with panchromatic light (44) from FIG. 8A has been exposed with blue light and developed, forming a pattern of cured pan-photopatternable material (46) registered with the blue color absorber pattern (14) of multicolor mask (10).

Figure 8E:
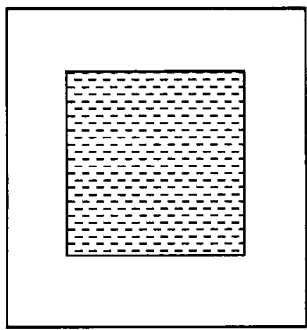
Figure 8F:
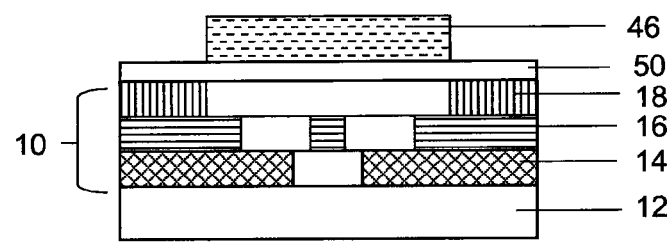

FIGS. 8E and 8F show a schematic plan view and cross-sectional view of the resulting structure after the film photopatternable with panchromatic light (44) from FIG. 8A has been exposed with green light and developed, forming a pattern of cured pan-photopatternable material (46) registered with the green color absorber pattern (18) of multicolor mask (10).

Figure 8G:
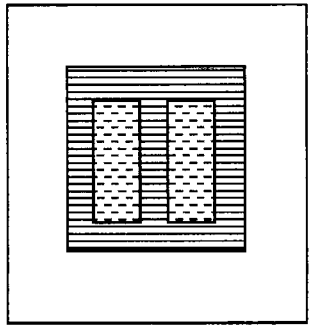
Figure 8H:
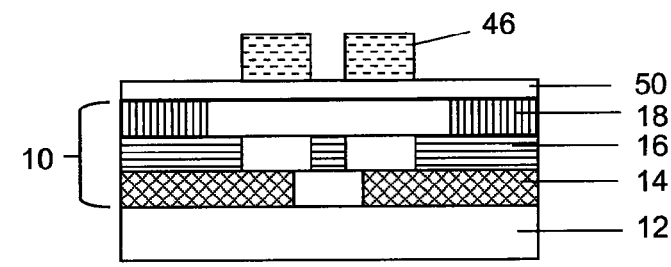

FIGS. 8G and 8H show a schematic plan view and cross-sectional view of the resulting structure after the film photopatternable with panchromatic light (44) from FIG. 8Aa has been exposed with red light and developed, forming a pattern of cured pan-photopatternable material (46) registered with the red color absorber pattern (16) of multicolor mask (10). It will be readily understood that combinations of patterns shown in FIGS. 8C-8H are possible simply by tuning the color of exposing light (i.e. a blue-plus-green light exposure will cure both shaded regions (46) shown in FIGS. 8C and 8E).

An important aspect of a preferred embodiment of the process is the ability to use one of the color patterns of the multicolor mask to form an aligned pattern of a functional material on at least a portion of the multicolor mask. A number of methods can be used to cause this patterning. Therefore, both functional materials and photopatternable materials are applied to the multicolor mask and patterned using colored light. General classes of functional materials that can be used include conductors, dielectrics or insulators, and semiconductors. The spectral distribution of illuminating light is modulated by the transmittance of all previously applied and patterned layers. For the purposes of this discussion, the multicolor mask (10) is defined as including all color absorbing portions of the patterned structure with the exception of the light curable film. Because the colored light photopatterning process described above and illustrated using FIGS. 5A-8H results in a change in permeability, solubility, tackiness, mechanical strength, surface reactivity, or index of refraction of the photopatterned material, these properties may be exploited in subsequent fabrication steps. Particularly useful methods to pattern functional and electronic materials are referred to as liftoff, selective etch, and selective deposition processes.

Figure 9A:
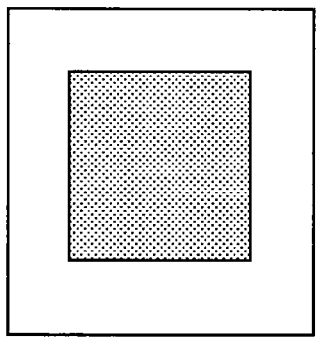
FIGS. 9A-9F show an example of a liftoff patterning process using a multicolor mask.
Figure 9B:
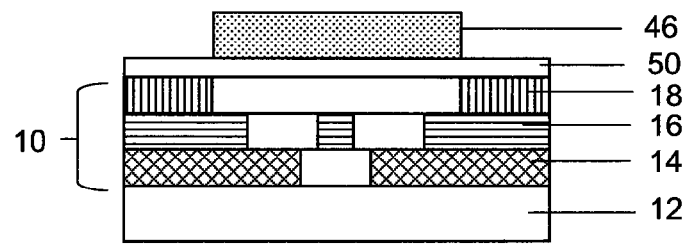
Figure 9C:
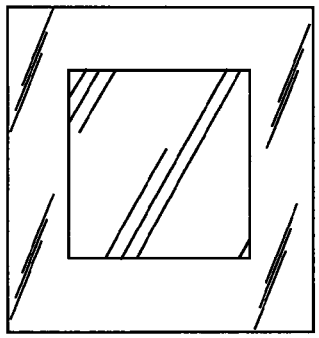
Figure 9D:
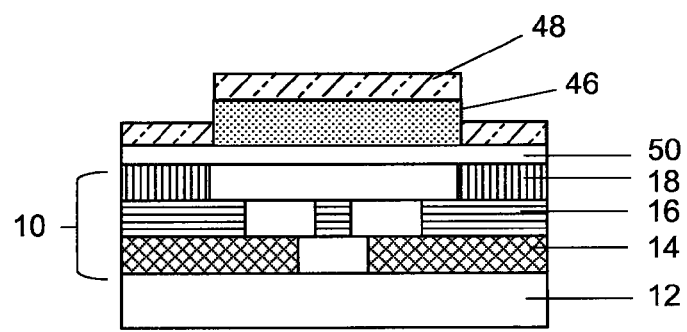
Figure 9E:
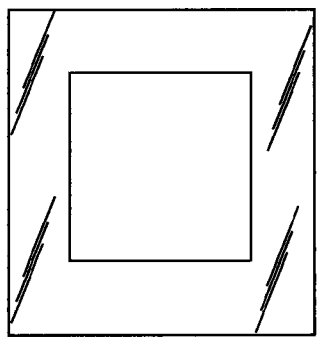
Figure 9F:
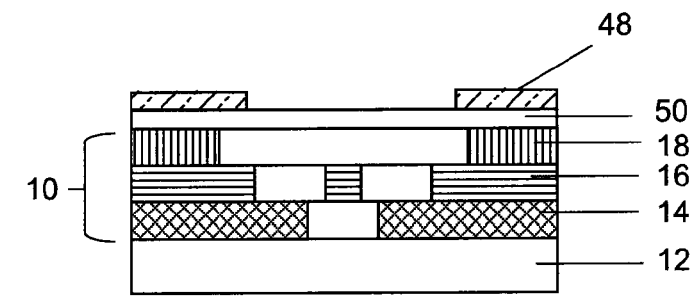

FIGS. 9A-9F show a liftoff patterning process. FIGS. 9A and 9B show a schematic plan view and cross-sectional view of the multicolor mask (10) with a pattern of photopatterned material (46) registered with green color absorber pattern (18). Referring now to FIGS. 9C and 9D, a uniform coating of transparent functional material (48) is applied over the pattern of photopatterned material (46). FIGS. 9D and 9E show the final step in a liftoff sequence when the cured material (46) and portions of transparent functional material on top of the cured material are removed. This is accomplished, for example, by treating the sample with a material that selectively attacks the remaining cured material under the functional material. This leaves functional material where there was originally no photopatterned material.

Figure 10A:
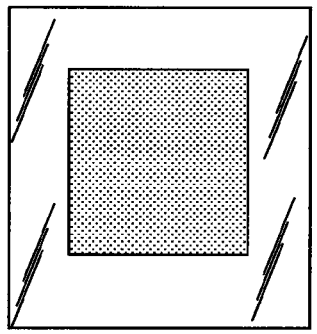
FIGS. 10A-10F show an example of a selective etch patterning process using a multicolor mask.
Figure 10B:
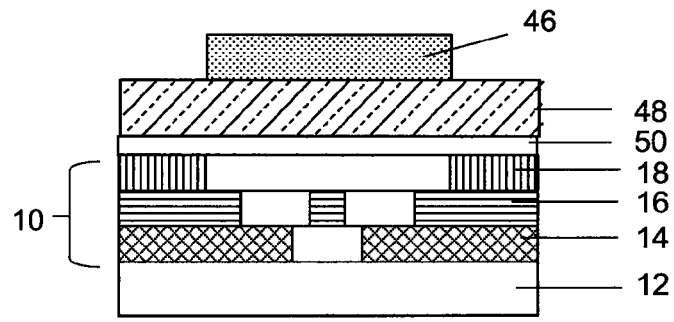
Figure 10C:
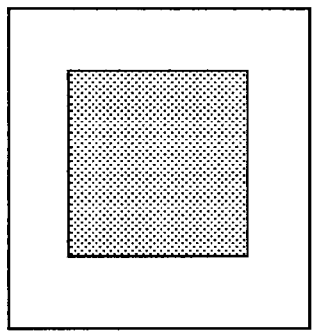
Figure 10D:
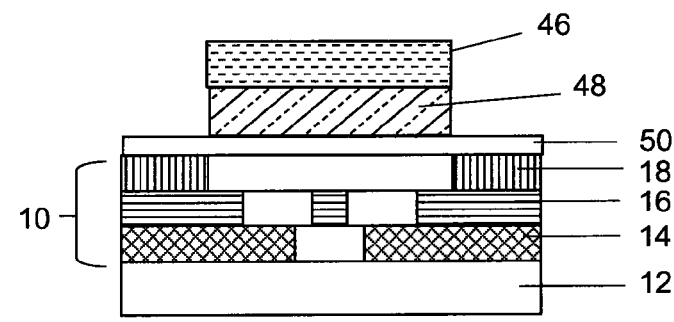
Figure 10E:
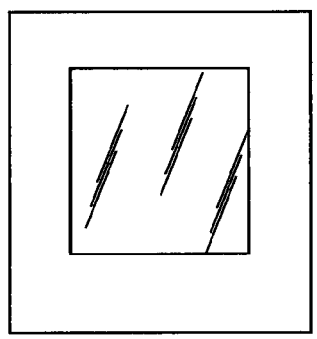
Figure 10F:
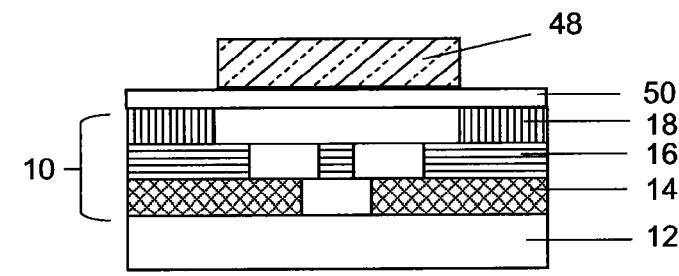

FIG. 10A-10F show a selective etch patterning process. FIGS. 10A and 10B show a schematic plan view and cross-sectional view of multicolor mask (10) with a uniform coating of transparent functional material (48) under a pattern of cured material (46) registered with green color absorber pattern (18). FIGS. 10C and 10D illustrate a subsequent step after the exposed portions of transparent functional material are removed in an etch process. The sample is exposed to a material that attacks or dissolves the functional layer. Regions of transparent functional material protected by the pattern of cured material (46) are not removed in the etch step. The pattern of transparent functional material (48) is registered with the pattern of cured material (46) and is also registered with green color absorber pattern (18). Referring now to FIGS. 10E and 10F there is illustrated the resulting structure after the pattern of cured material (46) is removed. This may be accomplished, for example, with a compatible solvent or oxygen plasma treatment.

A number of deposition processes employing both liquids and vapor phase chemical delivery can be tailored to operate in a manner where material selectively deposits only in certain areas. Compared to etch and liftoff patterning processes, selective area deposition processes are particularly attractive for building structured materials. This is because they can eliminate the need for an etch process for film patterning and reduce the number of cleaning steps required. They can also allow the patterning of materials difficult to etch or the patterning of layered structures which are difficult to etch selectively. For all these reasons, it is a goal of the present process to provide a patterned thin film that not only comprises deposition inhibitor material, but that is directly photopatternable using a multicolor mask.

As described above, SAD processes use a deposition inhibitor compound in order to inhibit the deposition of the thin film in the non-selected areas. This process can be better understood with reference to FIGS. 11A-11F, which show the operation of this system using a selective deposition patterning process in combination with the multicolor mask.

FIGS. 11A and 11B show multicolor mask (10) with a pattern of cured material (46) registered with green color absorber pattern (18). FIGS. 11C and 11D illustrate a subsequent step after a transparent functional material (48) is selectively deposited on regions of support (12) that are not covered by the pattern of cured material (46). Referring now to FIGS. 11E and 11F a subsequent step is illustrated where the pattern of cured material (46) is removed by treating entire to attack the remaining cured material. The pattern of transparent functional material (48) is registered with the green color absorber pattern (18).

Figure 13A:
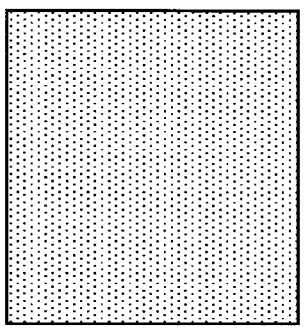
Figure 13B:
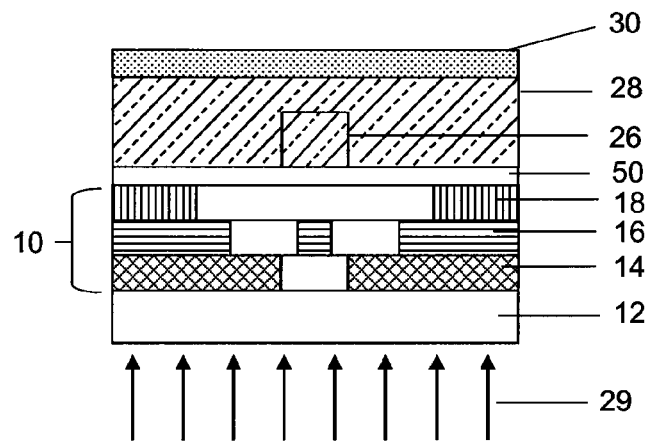
Figure 13C:
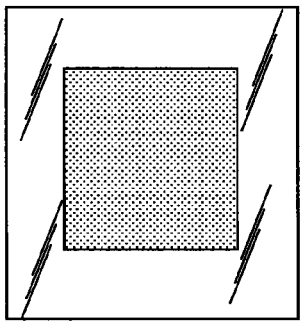
Figure 13D:
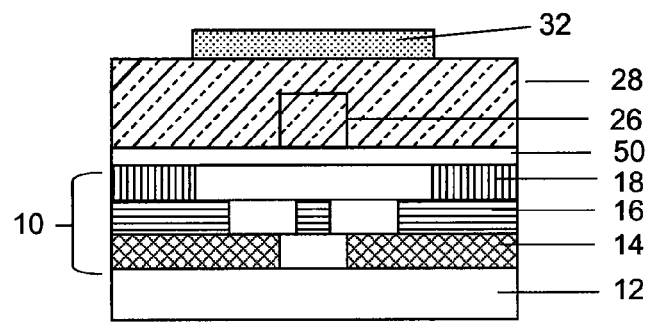
Figure 13E:
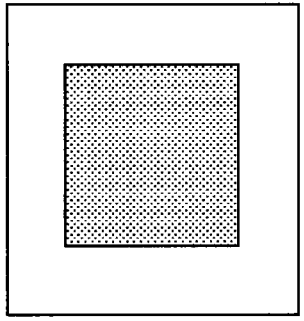
Figure 13F:
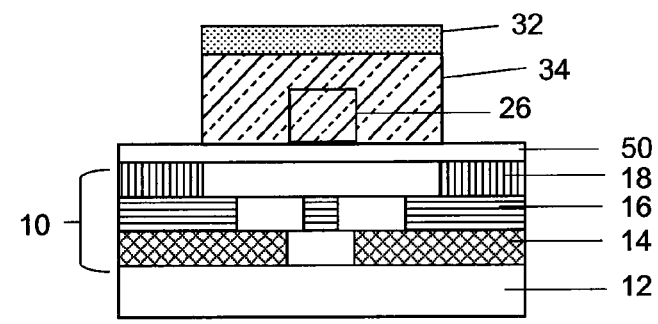
Figure 13G:
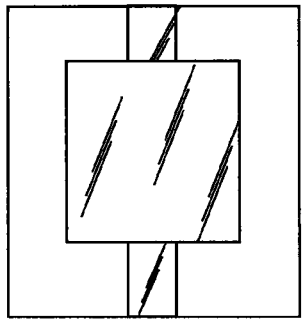
Figure 13H:
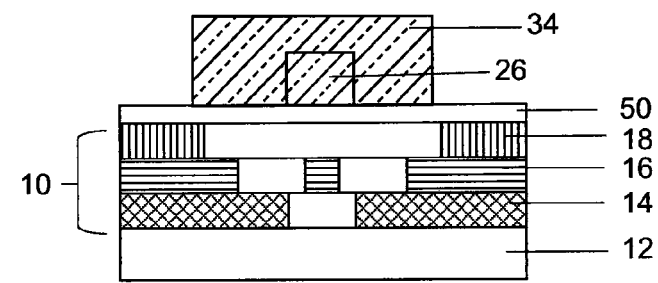
Figure 14A:
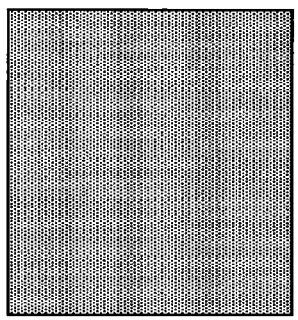
Figure 14B:
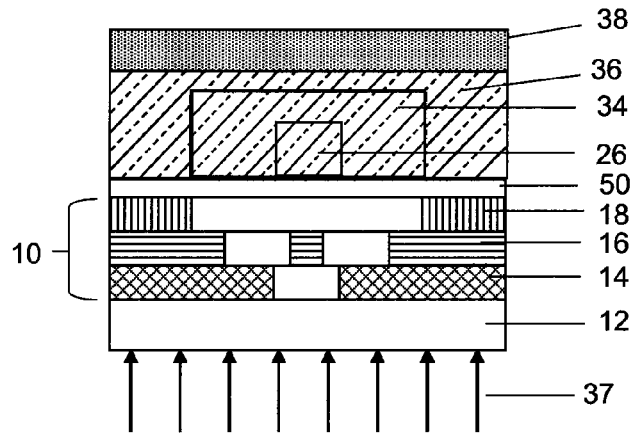
Figure 14C:
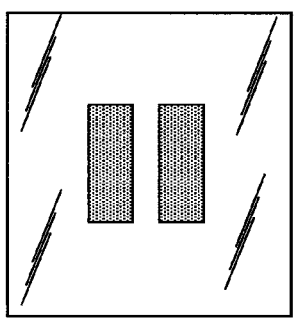
Figure 14D:
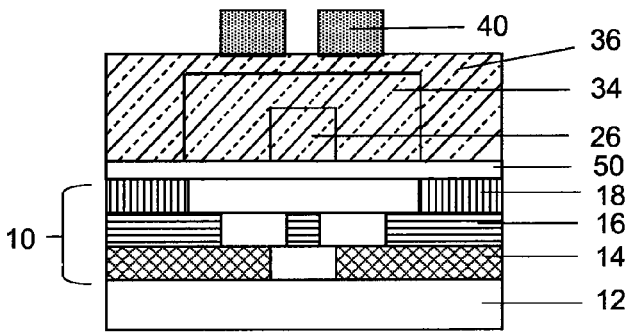
Figure 14E:
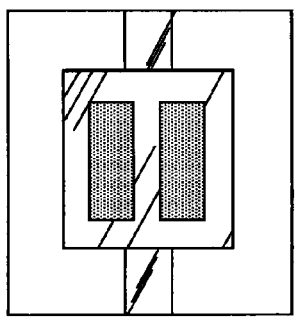
Figure 14F:
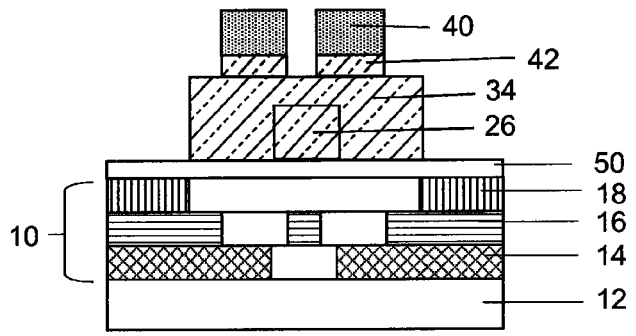
Figure 14G:
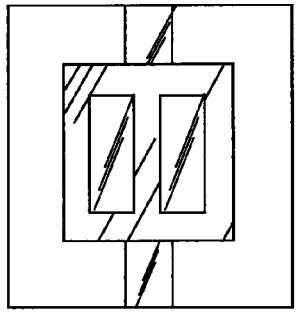
Figure 14H:
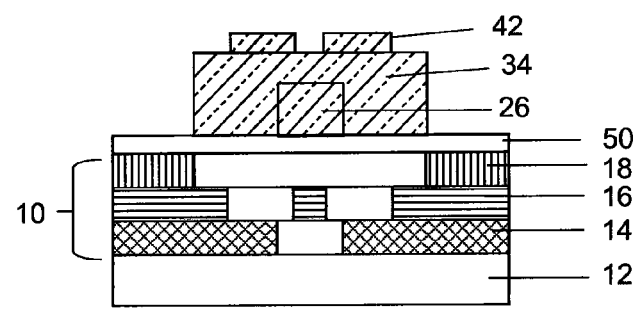

FIGS. 12A-14H show a possible sequence of exposure, processing, and deposition steps that would allow construction of a multilayer electronic device as seen in FIGS. 14G and 14H.

Figure 12A:
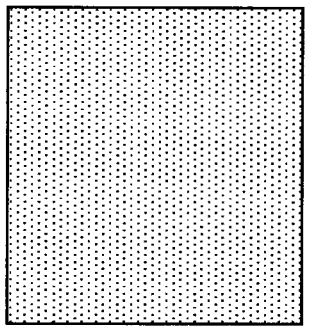
FIGS. 12A-14H show a possible sequence of exposure, processing, and deposition steps to form a multilayer electronic device using transparent components and a multicolor mask.
Figure 12B:
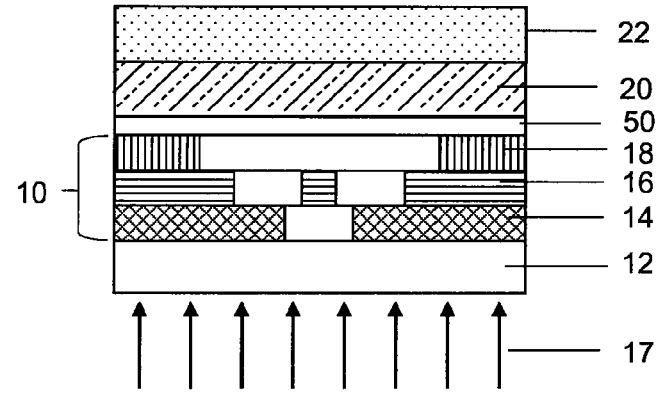
Figure 12C:
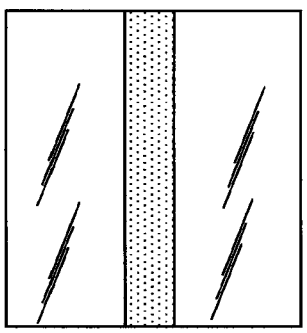
Figure 12D:
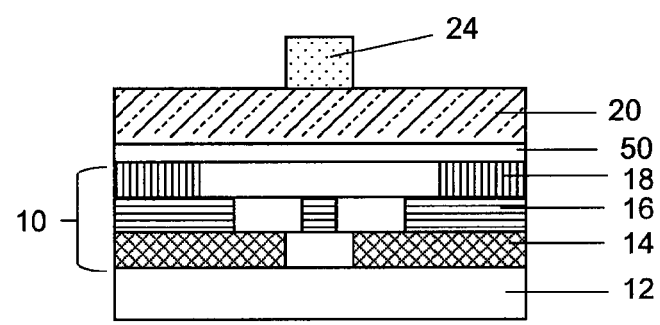
Figure 12E:
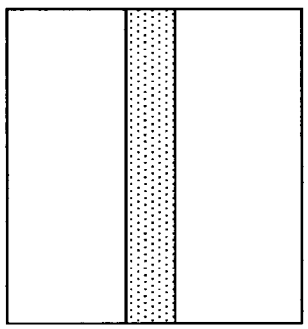
Figure 12F:
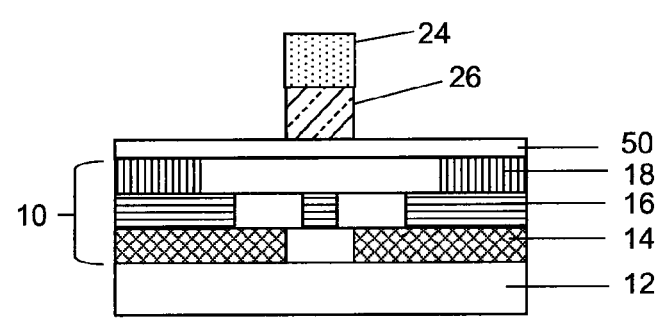
Figure 12G:
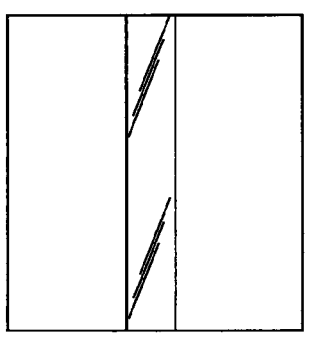
Figure 12H:
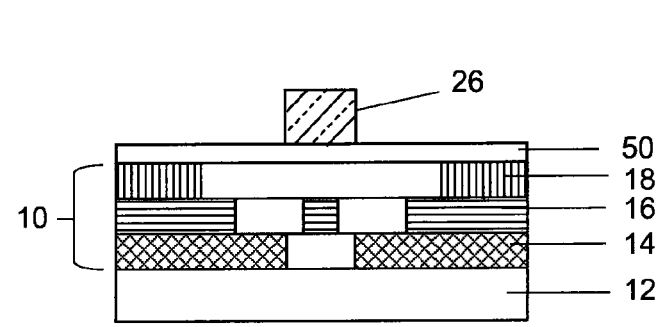

FIGS. 12A-12H illustrate the coating and patterning steps for the first transparent layer of a electronic device using a blue photopatternable coating and a selective etch process. Alternatively, the first transparent layer could be patterned by a selective deposition process, a liftoff process, or a light curing process. FIGS. 12A and 12B show multicolor mask (10) coated with a first transparent functional material (20) and a blue photopatternable material (22). This structure is exposed with a light source containing blue light. By way of illustration, the functional material (20) could be a transparent conducting oxide material such as ITO or aluminum doped ZnO. Because the photopatternable coating (22) drawn in this structure is sensitive only to blue light, the light source may provide white light source or a colored light containing blue light. Referring now to FIGS. 12C and 12D there is illustrated the resulting structure after the exposed blue photopatternable film has been developed, forming a pattern of blue cured material (24) registered with the blue color absorber pattern (14) of multicolor mask (10). FIGS. 12E and 12F show an etch step where exposed portions of transparent functional material (20) are removed in, for example, an acid bath, forming a pattern of transparent functional material (26) registered to the blue color absorber pattern (14) of multicolor mask (10). FIGS. 12G and 12H show the structure of FIG. 12E after the pattern of blue cured material (24) is removed using, for example, an oxygen plasma treatment.

FIGS. 13A-13H illustrate the coating and patterning steps for the second transparent layer of the electronic device using a green curable coating using a selective etch process. Alternatively, the second transparent layer could be patterned be a selective deposition process, a liftoff process, or a light curing process. FIGS. 13A and 13B show the multicolor mask (10), including the first patterned transparent layer, coated with a uniform layer of transparent functional material (28) and a green photopatternable layer (30). This structure is exposed with a light source containing green light. By way of example, the transparent functional material (28) could be a dielectric material such as aluminum oxide or alternatively a semiconducting layer such as zinc oxide. This material could be a dielectric or semiconducting layer precursor that is converted in an annealing step to form the electrically functional material. Multiple layers of transparent functional layers could potentially be coated at this step. By way of example, a transparent coating of a dielectric material could be first applied and a second transparent coating of semiconductor material could be subsequently applied. Because the photopatternable coating (30) shown in FIGS. 13A and 13B is sensitive only to green light, the light source may provide white light or colored light containing green light. FIGS. 13C and 13C show the resulting structure after the exposed green photopatternable material (30) from FIG. 30 has been developed, forming a pattern of green-cured material (32) registered with the green color absorber pattern (18) of multicolor mask (10).

Referring now to FIGS. 13E and 13F there is illustrated the structure of FIG. 13C after the exposed portions of transparent functional material (28) are removed in an etch step, forming a pattern of transparent functional material (34) registered to the green color absorber pattern (18) of multicolor mask (10). FIGS. 13G and 13H show the structure of FIG. 13E after the pattern of green cured material (32) is removed using, for example, an oxygen plasma treatment.

FIGS. 14A-14H illustrate the coating and patterning steps for the third transparent layer of the electronic device using a red curable coating using a selective etch process. Alternatively, the third layer could be patterned using a selective deposition process, a liftoff process, or a light curing process. FIGS. 14A and 14B show the multicolor mask (10), including the first and second patterned transparent layers, coated with a uniform layer of transparent functional material (36) and a red-photopatternable material (38). This structure is exposed with a light source containing red light. By way of example, the transparent functional material (36) could be a layer of indium-tin oxide or silver nanoparticles. Because the photopatternable coating (38) drawn in this structure is sensitive only to red light, the light source may provide white light or a colored light source containing red light.

FIGS. 14C and 14D show the resulting structure after the exposed red-photopatternable material (38) from FIG. 14A has been developed, forming a pattern of red-cured material (40) registered with the red color absorber pattern (16) of multicolor mask (10).

Referring now to FIGS. 14E and 14F there is illustrated the structure of FIG. 14C after the exposed portions of transparent functional material (36) are removed in an etch step, forming a pattern of transparent functional material (42) registered to the red color absorber pattern (16) of multicolor mask (10). FIGS. 14G and 14H show the structure of FIG. 14E after the pattern of red cured material (40) is removed. In this multilayer structure, the pattern of transparent functional material (26) is registered to the blue color absorber pattern (14) of multicolor mask (10). The pattern of transparent functional material (34) is registered to the green color absorber pattern (18) of multicolor mask (10). The pattern of transparent functional material (42) is registered to the red color absorber pattern (16) of multicolor mask (10).

Figure 15A:
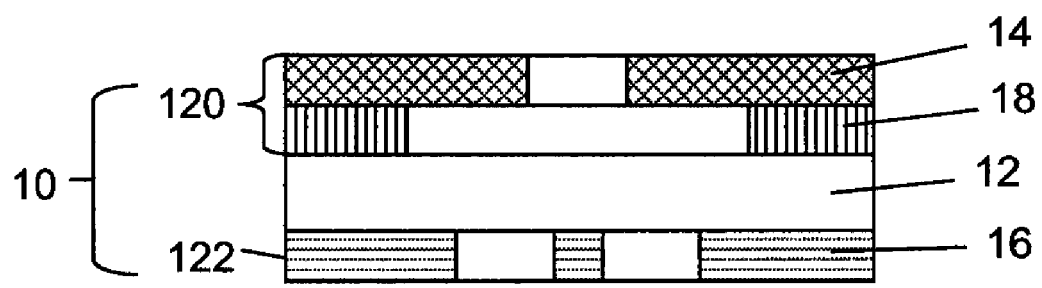
FIGS. 15A and 15B illustrate another embodiment of a multicolor mask of the present invention.
Figure 15B:
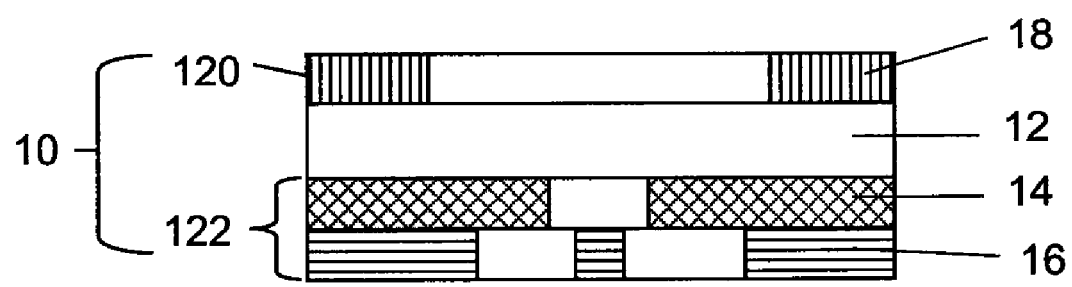

FIGS. 15A and 15B illustrate alternative arrangements of multicolor mask 10 according to the present invention. In these embodiments, multicolor mask 10 is made up of a first mask portion 120 formed on the first side of substrate and a second mask portion 122 formed on the backside of the substrate. This alternative arrangement has the advantage of allowing for the removal of a portion of the multicolor mask. The first mask portion 120 will remain in the final device, while the second mask portion 122 may be removed after completion of the final device. This may particularly useful in display devices that are viewed through the transparent substrate. The use of these alternative multicolor mask structures should be easily understood with respect to the previous Figs.

Figure 16A:
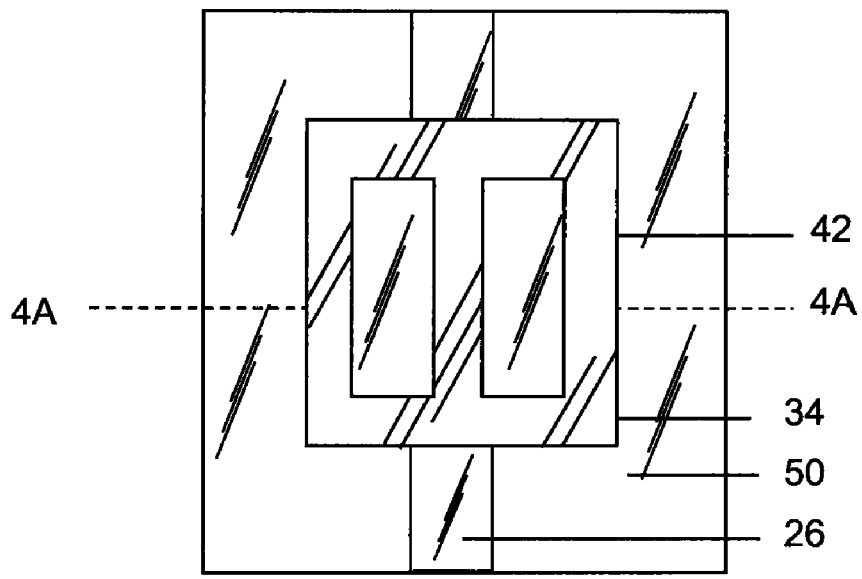
FIGS. 16A, 16B and 16C show another embodiment of a layer electronic device formed using a multicolor mask of the present invention.
Figure 16B:
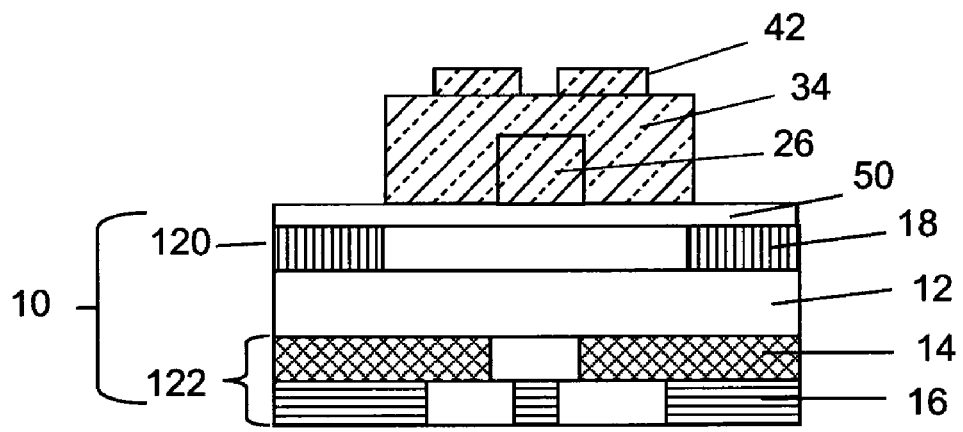
Figure 16C:
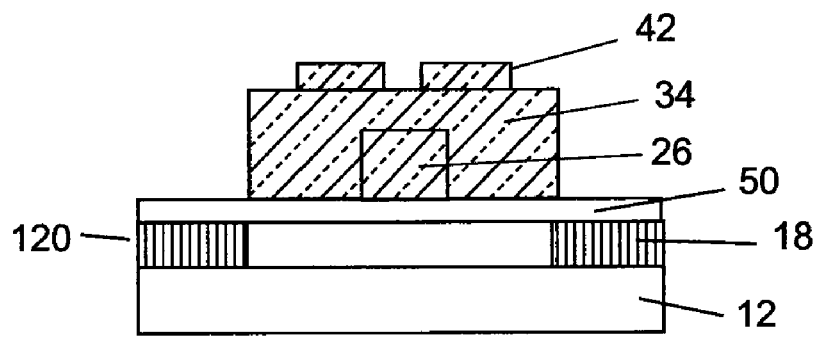

FIGS. 16A and 16B are analogous to FIGS. 14G and 14H, and illustrate a completed device formed using a multicolor mask with a first mask portion 120 formed on the first side of substrate and a second mask portion 122 formed on the backside of the substrate. FIG. 16C illustrates the completed device after the additional step of removing the second mask portion.

An important aspect of the present process is the multicolor mask can contain in one structure most or all of the patterning information for the system. This multicolor mask can be generated by any method that produces an image containing the desired colors with sufficient precision and registration for the anticipated application.

The different color absorbers in the multicolor mask may be sequentially or simultaneously deposited and patterned by many methods. One method to produce the multicolor mask is to print the mask using inks containing dyes or pigments with the appropriate spectral qualities. Inks used in the printing could be of any common formulation, which would typically include the colorant material along with a vehicle or solvent, binders, and surfactants. Examples of such multicolor printing systems are inkjet printing, gravure printing, flexography, offset lithography, screen or stencil printing, and relief printing. Color thermographic printing may be used to produce the different color absorbing layers on the support. Thermochromic compounds, bleachable dyes, heat decomposable compounds, or chemical color formers may be used to form the different color absorbing layer patterns on the support. The different color absorbers may be applied to the support using a laser or thermal transfer process from a donor sheet. Alternately, the color absorbing patterns may be produced on the support by an ablative recording process.

Particularly useful color absorbers are those materials with maximum absorption in a selected portion of the visible band and maximum transmission in remaining portions. So-called block-type dyes and cutoff filter materials are ideal for use in the multicolor mask. The different color absorbers may be applied in any convenient order, or applied in a single layer dispersed in a binder. A receiving layer for color absorbing materials may optionally be coated on the back side of the support before the color absorbing materials are applied.

The different color absorbers in the multicolor mask may be formed by a photolithographic method using, for example, dyed photocurable coatings, such as pigmented or dyed photoresist.

It may be particularly convenient and cost effective to produce a reusable master image for subsequent duplication on the main substrate. In this embodiment, a master mask image is produced of very high accuracy and resolution. This may be accomplished with any of the above techniques. Preferably, this would be done with a photolithographic method that allows a very high quality master image to be produced. It may even be preferable to produce the master image upon a rigid transparent substrate in order to achieve highly accurate vertical alignment between color absorbing layers. The color information in the master color image can be reproduced on the main substrate using a color duplicating or color copying process. For negative-working duplication processes, the master color image would be provided as a negative copy of the multicolor mask.

In a traditional photolithographic process for large area electronic device fabrication, excellent alignment must be achieved over very large areas. In the above method of master duplication, the master may be considerably smaller and thus easier to fabricate, but then duplicated on the final substrate in a replicating pattern so as to cover a larger area. Although this method of stepping is used for individual mask layers in a conventional photolithographic process, in those processes excellent alignment is still required within the stepping operation. In the current inventive process, considerable tolerance can exist in the location of the individual duplications, since each will contain all the required information for a multilayer pattern.

Color image capture processes employing light sensitive materials may be used to reproduce the master color image. The light sensitive layers can be composed of any set of materials capable of capturing a multicolor light pattern and subsequently being treated or developed in a way to produce a color pattern. Examples of such multicolor image capture materials are color negative photographic imaging layers, color reversal photographic imaging layers, color photothermographic imaging layers, Cycolor imaging layers, and diffusion transfer color photographic imaging layers such as color instant films, and color Pictrography film. A master color image may alternatively be reproduced on the main substrate using a color duplicating or copying process such as color electrophotography.

A multicolor mask can be produced on a separate roll of material and then laminated to the substrate. Preferably the lamination is done with the image side of the mask opposite the substrate and that the mask image is as close as possible to the functional layers to be patterned. For embodiments with a portion of the mask on the back side of the substrate, the lamination should be done such that the mask image is as close to the substrate as possible.

It may be particularly advantageous for optical considerations to coat the main support layer directly onto the color absorbing layers of the multicolor mask. In this embodiment, the color absorbing layers could be patterned on a carrier support roll and then the main support layer could be cast directly onto the color absorbing layers.

Alternately, the color absorbing layers can be patterned on a separate (donor) roll of material and then all of the color absorbing layers can be transferred in a single step from the donor roll onto the main substrate.

Multicolor mask layers may be separated from electronically active layers by a barrier layer. Depending on the application, it may be preferable to place the color layers on the back of a thin support so they may be bleached or removed at the end of the fabrication process and will not create planarity and contamination problems for the active device layers. As noted above, having a portion of the multicolor mask on the device side of the substrate and a portion on the backside, for potential removal, is advantageous for some devices.

In view of the above, it is useful to understand the resolution limit for a remotely exposed photoresist layer. This type of exposure is referred to as a proximity exposure in traditional photolithography. In proximity mode, the mask does not contact the wafer, so there are resolution losses due to diffraction effects. A useful discussion of resolution in this so-called proximity printing mode can be found in "Photoreactive Polymers: The Science and Technology of Resists" by A. Reiser, Wiley-Interscience, John Wiley & Sons, 1989, pp. 234-246.

The diffraction effect in proximity printing limits the minimum feature gap on the mask as described by Equation (1):

$$W_{min} \approx \sqrt{k \lambda S} \quad k \approx 1 \qquad \text{Equation (1)}$$

where $W_{min}$ is the minimum feature gap on the mask, $\lambda$ is the exposure wavelength, and S is the separation between the mask and the wafer. Similarly, the minimum line/gap period is given by the relationship:

$$2b_{min} = 3\sqrt{\lambda\left(s + \frac{z}{2}\right)} \qquad \text{Equation (2)}$$

where $b_{min}$ is the minimum line gap period, $\lambda$ is the exposure wavelength, s is the separation between the mask and the wafer, and z is the resist thickness.

These models indicate that even for a 100 μm typical for flexible supports, 6-8 μm features are resolvable, depending on the exposure wavelength. Again at the 100 μm distance, a line/gap periodicity in the range 9-12 μm should be resolvable, depending on the exposure wavelength. In the case of front-side masking, the barrier thickness is also highly tunable. Table A uses Equations (1) and (2) to predict the minimum feature size and periodicity as a function of the mask and resist separation. Examples using 365 nm or 650 nm exposing light are shown as representative of the two ends of the visible spectrum.

TABLE A

|  | Exposing wavelength (nm) | Mask and resist layer separation | | |
| --- | --- | --- | --- | --- |
|  |  | 1 um separation | 10 um separation | 100 um separation |
| Wmin minimum resolvable gap (μm) | 365 | 0.6 | 2 | 6 |
|  | 650 | 0.8 | 2.5 | 8 |
| bmin minimum | 365 | 1.1 | 3 | 9 |
| resolvable periodicity (μm) | 650 | 1.5 | 4 | 12 |

Based on these models, the multicolor mask can be designed to meet the resolution and transparency requirements of the final device.

Many polymers can be caused to vary their properties by exposure to light and, thus, be useful as photopatternable layers, either as a photopatternable deposition inhibitor material or as photoresist for other patterning techniques not involving SAD. Photopatternable materials useful in the present invention are those which cause selected area deposition, which will be better understood from the discussion below. Many typical light sensitive polymers are only sensitive to UV and deep UV radiation. Preferably the photopatternable materials for this invention are rendered sensitive to visible light.

The phrase "deposition inhibitor material" refers herein to the material applied to the substrate as well as the material resulting from any optionally subsequent crosslinking or other reaction that modifies the material that may occur prior to depositing a functional material on the substrate. Preferably, a polymeric photosensitive deposition inhibitor material can be crosslinked after applying the polymer onto the substrate via exposure to visible light.

A photopatternable deposition inhibitor material can comprise a compound or polymer that, after being applied, is subsequently polymerized and/or crosslinked. Polymers are preferably addition polymers such as, for example, a poly (perfluoroalkyl methacrylate); poly(perfluoroalkyl methacrylate); poly(methyl methacrylate); poly(cyclohexyl methacrylate); poly(benzyl methacrylate); poly(iso-butylene); poly(9,9-dioctylfluorenyl-2,7-diyl); polystyrene; poly(vinyl alcohol); poly(methyl methacrylate); poly(hexafluorobutyl methacrylate), and copolymers thereof, wherein the alkyl has one to six carbon atoms. The deposition inhibitor materials preferably have an inhibition power; in which the inhibition power is defined as the functional layer thickness at or below which the deposition inhibitor material is effective, of at least 50 Å, more preferably at least 100 Å, most preferably at least 300 Å.

Crosslinking can be used to insolubilize a polymeric deposition inhibitor material after application onto the surface of the substrate. The crosslinking can occur prior to patterning or may occur during patterning in order to contribute to the patterning step, for example, by employing crosslinking initiated by, and patterned by, exposing the photopatternable deposition inhibitor through the multicolor mask, followed by removal of non-crosslinked polymer, for example, by solvent.

For use in a photoresist or photopatternable deposition inhibitor material, a variety of photopolymerization systems that are activated by visible radiation have been developed. A useful discussion of UV curable and visible light photopatternable materials can be found in "Photoreactive Polymers: The Science and Technology of Resists" by A. Reiser, Wiley-Interscience, John Wiley & Sons, 1989, pp. 102-129. U.S. Pat. No. 4,859,572 by Farid et al., incorporated here by reference, describes a photographic imaging system, which relies on using visible light to harden an organic component and produce an image pattern. This reference describes a variety of suitable visible light sensitive photoinitiators, monomers, and film formulation guidelines for use in the curable layers of this process.

Sensitivity to visible light can be accomplished by the use of polymerizable compound along with a photopolymerization initiator. In a preferred embodiment of the invention, a photoresist and/or photopatternable deposition inhibitor contains a polymerizable compound selected from among compounds having at least one, preferably two or more, ethylenically unsaturated bond at terminals. Such compounds are well known in the industry and they can be used in the present invention with no particular limitation. Such compounds have, for example, the chemical form of a monomer, a prepolymer, i.e., a dimer, a trimer, and an oligomer or a mixture and a copolymer of them. As examples of monomers and copolymers thereof, unsaturated carboxylic acids (e.g., acrylic acid, methacrylic acid, itaconic acid; crotonic acid, isocrotonic acid, maleic acid, etc.), and esters and amides thereof can be exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of unsaturated carboxylic esters and amides having a nucleophilic substituent such as a hydroxyl group, an amino group and a mercapto group with monofunctional or polyfunctional isocyanates and epoxies, and the dehydration condensation reaction products of these compounds with monofunctional or polyfunctional carboxylic acids are also preferably used. The addition reaction products of unsaturated carboxylic esters and amides having electrophilic substituents such as an isocyanato group and an epoxy group with monofunctional or polyfunctional alcohols, amines and thiols, and the substitution reaction products of unsaturated carboxylic esters and amides having releasable substituents such as a halogen group and a tosyloxy group with monofunctional or polyfunctional alcohols, amines and thiols are also preferably used. As another example, it is also possible to use compounds replaced with unsaturated phosphonic acid, styrene, vinyl ether, etc., in place of the above-unsaturated carboxylic acids.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, etc. As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, and bis[p-(3-methacryloxy-2-hydroxy-propoxy)phenyl]dimethylmethane, bis[p-(methacryloxyethoxy)-phenyl]dimethylmethane. As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. As crotonates, examples include ethylene glycol dicrotonate, tetramethylene glycol dicrotonate, pentaerythritol dicrotonate, and sorbitol tetradicrotonate. As isocrotonates, examples include ethylene glycol diisocrotonate, pentaerythritol diisocrotonate, and sorbitol tetraisocrotonate. As maleates, examples include ethylene glycol dimaleate, triethylene glycol dimaleate, pentaerythritol dimaleate, and sorbitol tetramaleate. Further, the mixtures of the above-described ester monomers can also be used. Further, specific examples of amide monomers of aliphatic polyhydric amine compounds and unsaturated carboxylic acids include methylenebis acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, and xylylenebis-methacrylamide.

Further, urethane-based addition polymerizable compounds which are obtained by the addition reaction of an isocyanate and a hydroxyl group can also be used in the present process in a photoresist or photopatternable deposition inhibitor. A specific example is a vinyl urethane compound having two or more polymerizable vinyl groups in one molecule, which is obtained by the addition of a vinyl monomer having a hydroxyl group represented by the following formula (V) to a polyisocyanate compound having two or more isocyanate groups in one molecule.

wherein R and R' each represents H or CH$_3$.

Other examples include polyfunctional acrylates and methacrylates, such as polyester acrylates, and epoxy acrylates obtained by reacting epoxy resins with (meth)acrylic acids. Moreover, photo-curable monomers and oligomers listed in Sartomer Product Catalog by Sartomer Company Inc. (1999) can be used as well.

Depending upon the final design characteristics of the photosensitive material, a suitable addition polymerizable compound or combination of addition polymerizable compounds, having the desired structure and amounts can be used. For example, the conditions are selected from the following viewpoint. For the photosensitive speed, a structure containing many unsaturated groups per molecule is preferred and in many cases bifunctional or more functional groups are preferred. For increasing the strength of an image part, i.e., a cured film, trifunctional or more functional groups are preferred. It is effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength, but may not be preferred from the point of development speed and precipitation in a developing solution. The selection and usage of the addition polymerizable compound are important factors for compatibility with other components (e.g., a binder polymer, an initiator, a functional material, etc., as the case may be) in the photopolymerization composition. For example, sometimes compatibility can be improved by using a low purity compound or two or more compounds in combination. Further, it is also possible to select a compound having specific structure for the purpose of improving an adhesion property. Concerning the compounding ratio of the addition polymerizable compound in a photopolymerization composition, the higher the amount, the higher the sensitivity. But, too large an amount sometimes may result in disadvantageous phase separation, problems in the manufacturing process due to the stickiness of the photopolymerization composition (e.g., manufacturing failure resulting from the transfer and adhesion of the photosensitive material components), and precipitation from a developing solution. The addition polymerizable compound may be used alone or in combination of two or more. In addition, appropriate structure, compounding ratio and addition amount of the addition polymerizable compound can be arbitrarily selected taking into consideration the degree of polymerization hindrance due to oxygen, resolving power, fogging characteristic, refractive index variation and surface adhesion.

Organic polymeric binders which can optionally form a part of the film forming component of a photopatternable layer include: (1) polyesters, including those based on terephthalic, isophthalic, sebacic, adipic, and hexahydroterephthalic acids; (2) nylons or polyamides; (3) cellulose ethers and esters; (4) polyaldehydes; (5) high molecular weight ethylene oxide polymers—e.g., poly(ethylene glycols), having average weight average molecular weights from 4000 to 4,000,000; (6) polyurethanes; (7) polycarbonates; (8) synthetic rubbers—e.g., homopolymers and copolymers of butadienes; and (9) homopolymers and copolymers formed from monomers containing ethylenic unsaturation such as polymerized forms of any of the various ethylenically unsaturated monomers, such as polyalkylenes—e.g. polyethylene and polypropylene; poly(vinyl alcohol); polystyrene; poly(acrylic and methacrylic acids and esters)—e.g. poly(methyl methacrylate) and poly(ethyl acrylate), as well as copolymer variants. The polymerizable compound and the polymeric binder can be employed together in widely varying proportions, including polymerizable compound ranging from 3 to 97 percent by weight of the film forming component and polymeric binder ranging from 97 to 3 percent by weight of the film forming component. A separate polymeric binder, although preferred, is not an essential part of the photopatternable film and is most commonly omitted when the polymerizable compound is itself a polymer.

Various photoinitiators can be selected for use in the above-described imaging systems. Preferred photoinitators consist of an organic dye.

The amount of organic dye to be used is preferably in the range of from 0.1 to 5% by weight based on the total weight of the photopolymerization composition, preferably from 0.2 to 3% by weight.

The organic dyes for use as photoinitiators in the present invention may be suitably selected from conventionally known compounds having a maximum absorption wavelength falling within a range of 300 to 1000 nm. High sensitivity can be achieved by selecting a desired dye having an absorption spectrum that overlaps with the absorption spectrum of the corresponding color absorbing material of the multicolor mask described above and, optionally, adjusting the absorption spectrum to match the light source to be used. Also, it is possible to suitably select a light source such as blue, green, or red, or infrared LED (light emitting diode), solid state laser, OLED (organic light emitting diode) or laser, or the like for use in image-wise exposure to light.

Specific examples of the photoinitiator organic dyes include 3-ketocoumarin compounds, thiopyrylium salts, naphthothiazolemerocyanine compounds, merocyanine compounds, and merocyanine dyes containing thiobarbituric acid, hemioxanole dyes, and cyanine, hemicyanine, and merocyanine dyes having indolenine nuclei. Other examples of the organic dyes include the dyes described in Chemistry of Functional Dyes (1981, CMC Publishing Co., Ltd., pp. 393-416) and Coloring Materials (60[4], 212-224, 1987). Specific examples of these organic dyes include cationic methine dyes, cationic carbonium dyes, cationic quinoimine dyes, cationic indoline dyes, and cationic styryl dyes. Examples of the above-mentioned dyes include keto dyes such as coumarin dyes (including ketocoumarin and sulfonocoumarin), merostyryl dyes, oxonol dyes, and hemioxonol dyes; nonketo dyes such as nonketopolymethine dyes, triarylmethane dyes, xanthene dyes, anthracene dyes, rhodamine dyes, acridine dyes, aniline dyes, and azo dyes; nonketopolymethine dyes such as azomethine dyes, cyanine dyes, carbocyanine dyes, dicarbocyanine dyes, tricarbocyanine dyes, hemicyanine dyes, and styryl dyes; quinoneimine dyes such as azine dyes, oxazine dyes, thiazine dyes, quinoline dyes, and thiazole dyes.

Preferably, the photoinitiator organic dye is a cationic dye-borate anion complex formed from a cationic dye and an anionic organic borate. The cationic dye absorbs light having a maximum absorption wavelength falling within a range from 300 to 1000 nm and the anionic borate has four R groups, of which three R groups each represents an aryl group which may have a substitute, and one R group is an alkyl group, or a substituted alkyl group. Such cationic dye-borate anion complexes have been disclosed in U.S. Pat. Nos. 5,112,752; 5,100,755; 5,057,393; 4,865,942; 4,842,980; 4,800,149; 4,772,530; and 4,772,541, which are incorporated herein by reference.

When the cationic dye-borate anion complex is used as the organic dye in the photopolymerization compositions of the invention, it does not require to use the organoborate salt. However, to increase the photopolymerization sensitivity, it is preferred to use an organoborate salt in combination with the cationic dye-borate complex. The organic dye can be used singly or in combination.

Specific examples of the above-mentioned cationic dye-borate salts are given below. However, it should be noted that the present invention is not limited to these examples.

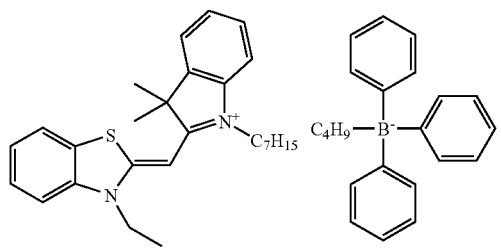

Dye-1

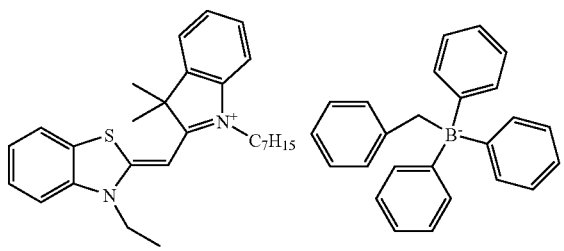

Dye-2

-continued
Dye-3
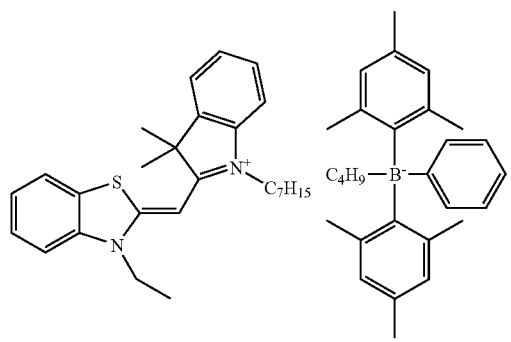
Dye-4
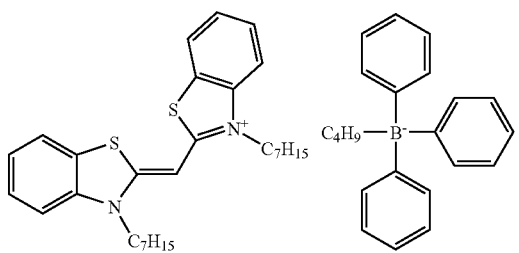
Dye-5
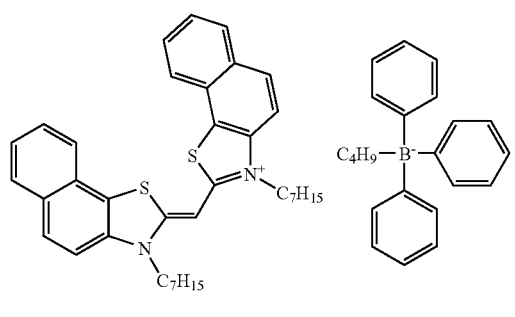
Dye-6
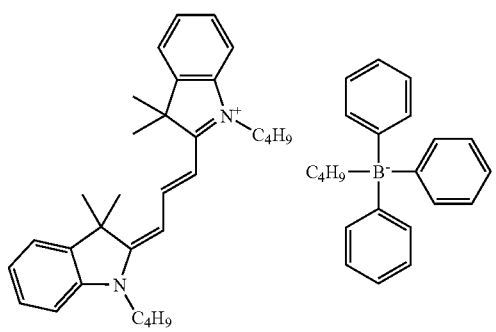
Dye-7
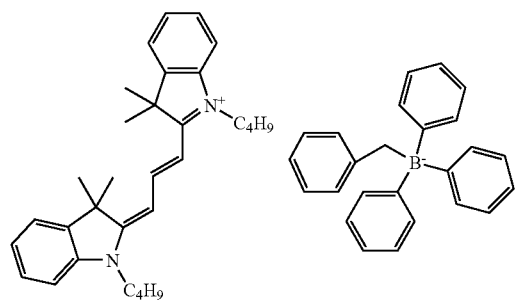
Dye-8
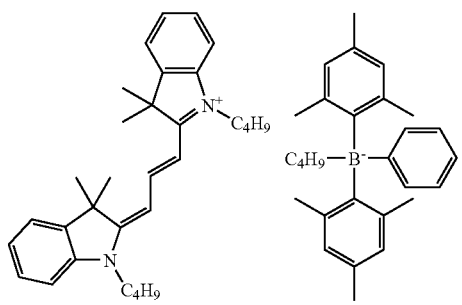
Dye-9
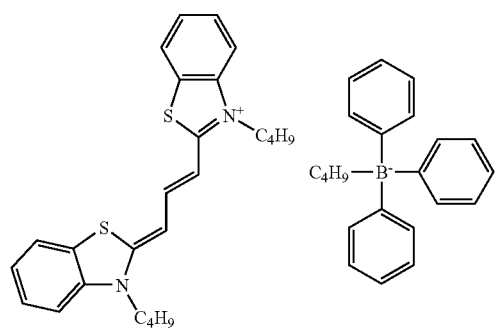
Dye-10
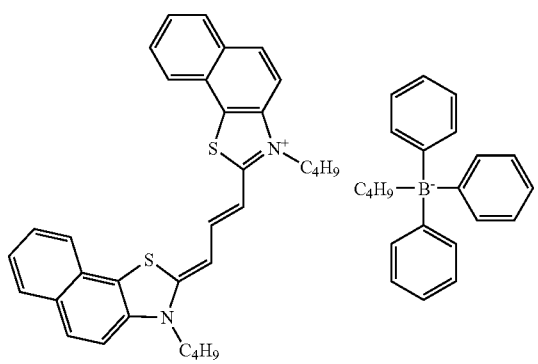

-continued
Dye-11
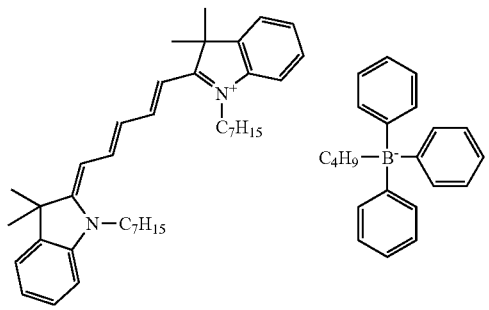
Dye-12
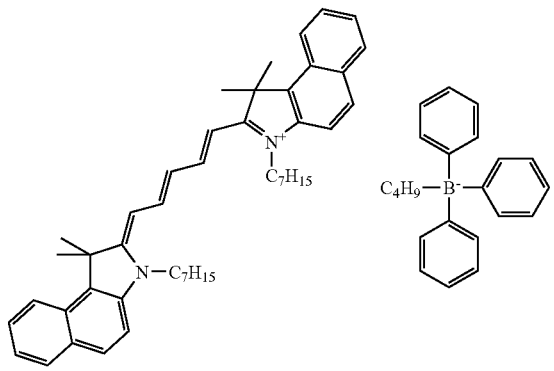
Dye-13
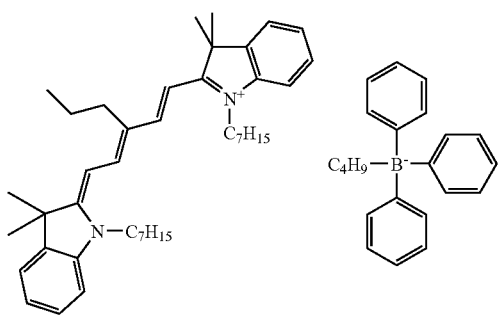
Dye-14
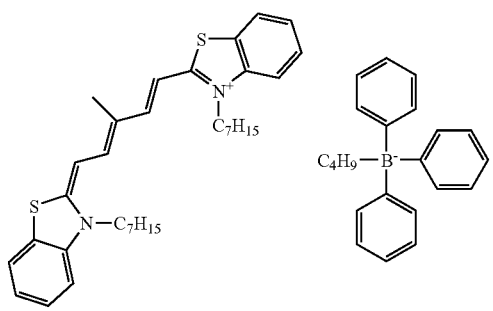
Dye-15
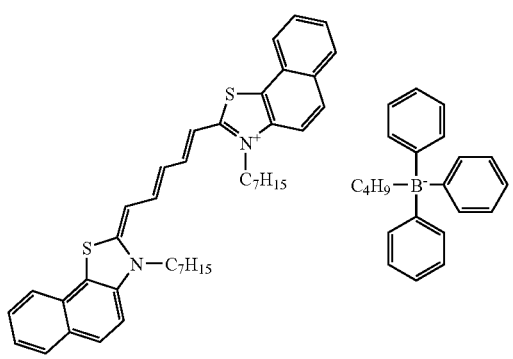
Dye-16
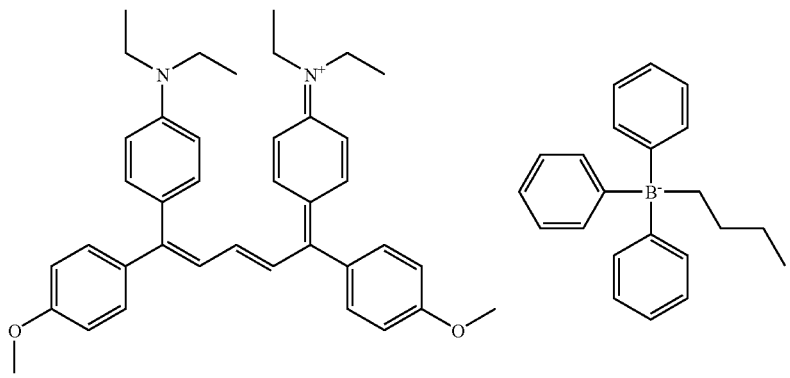

-continued

Dye-17

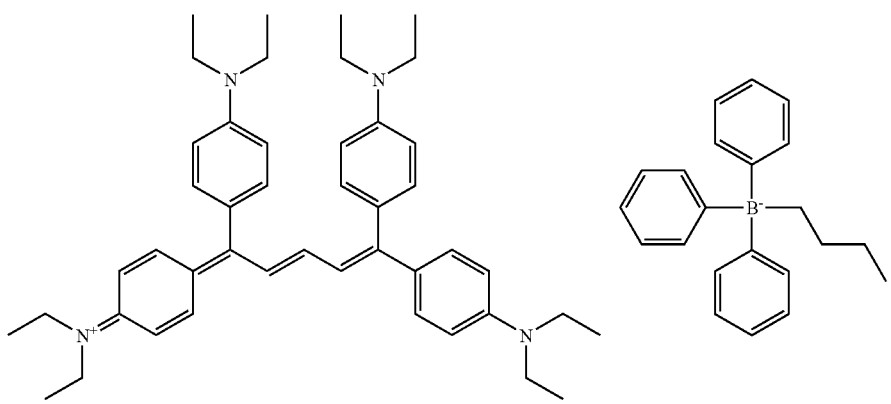

Dye-18

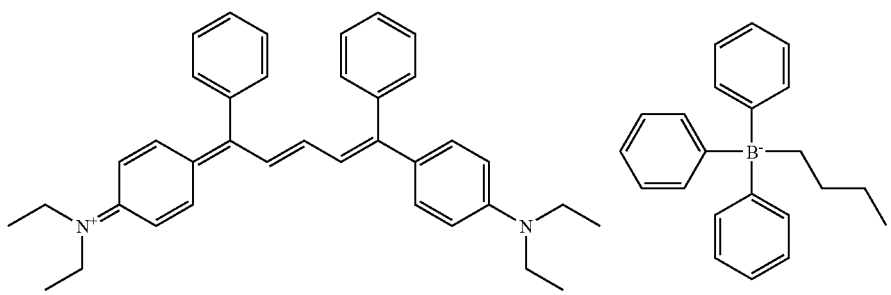

Dye-19

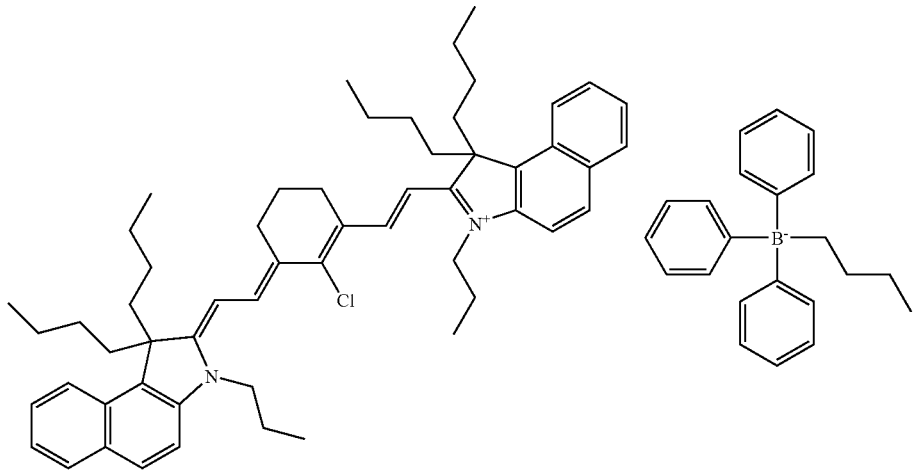

It may be preferable to use the photoinitiator in combination with an organic borate salt such as disclosed in U.S. Pat. Nos. 5,112,752; 5,100,755; 5,057,393; 4,865,942; 4,842,980; 4,800,149; 4,772,530; and 4,772,541. If used, the amount of borate compound contained in the photopolymerization composition of the invention is preferably from 0% to 20% by weight based on the total amount of photopolymerization composition. The borate salt useful for the photosensitive composition of the present invention is represented by the following general formula (I).

[BR$_4$]$^-$Z$^+$ where Z represents a group capable of forming cation and is not light sensitive, and [BR4]$^-$ is a borate compound having four R groups which are selected from an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkynyl group, an alicyclic group, a substituted alicyclic group, a heterocyclic group, a substituted heterocyclic group, and a derivative thereof. Plural Rs may be the same as or different from each other. In addition, two or more of these groups may join together directly or via a substituent and form a boron-containing heterocycle. Z+ does not absorb light and represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se.

Specific examples of the above-mentioned borate salts are given below. However, it should be noted that the present invention is not limited to these examples.

BS-1 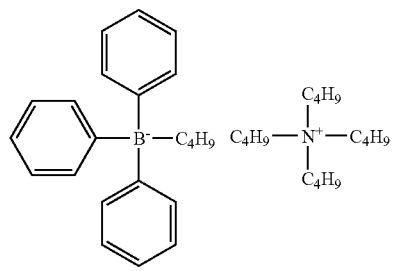 BS-2 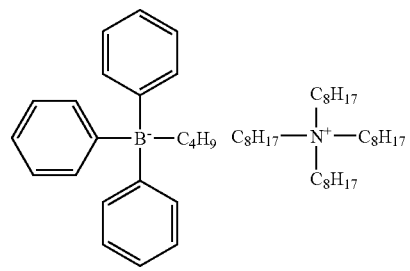
BS-3 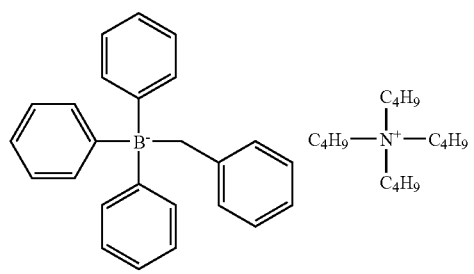 BS-4 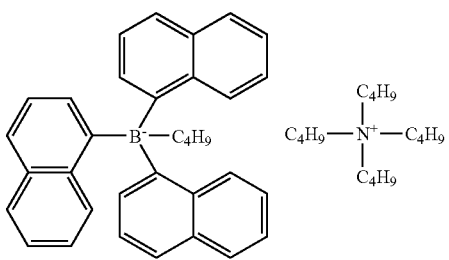
BS-5 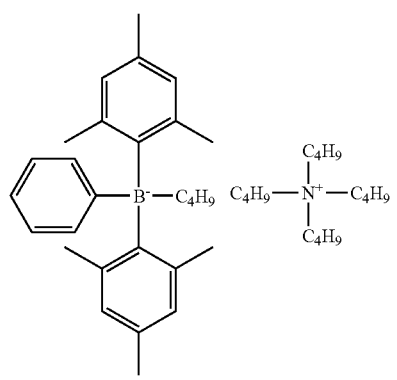 BS-6 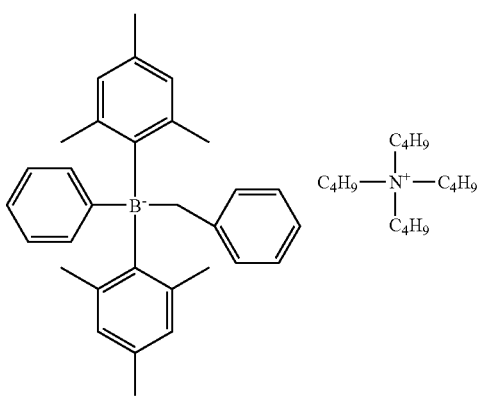
BS-7 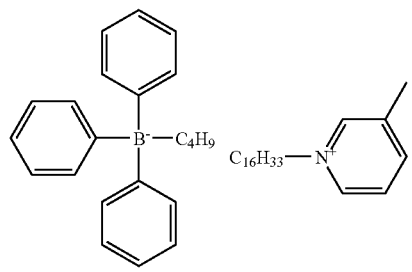 BS-8 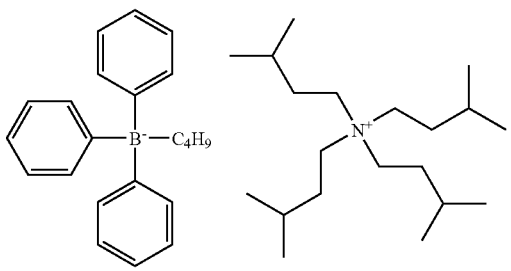
BS-9 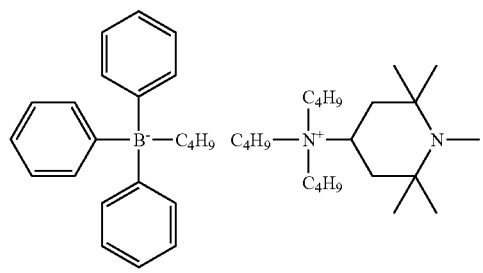 BS-10 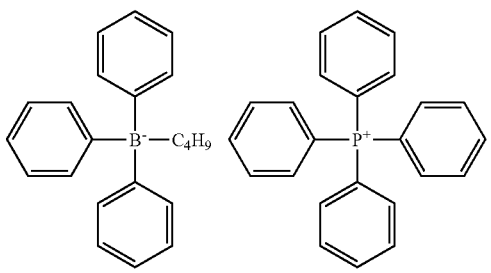

-continued

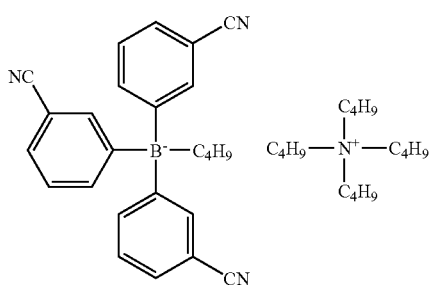
BS-11

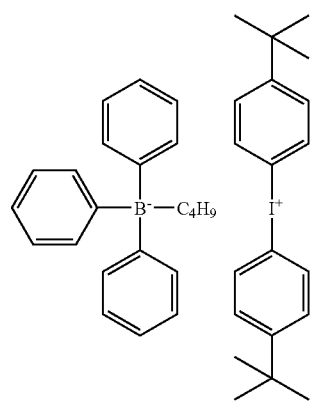
BS-12

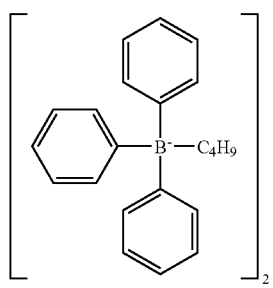
BS-13

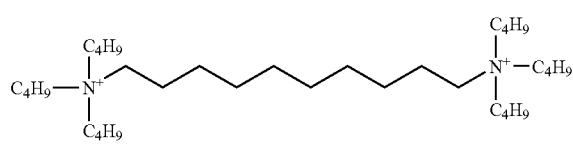
BS-14

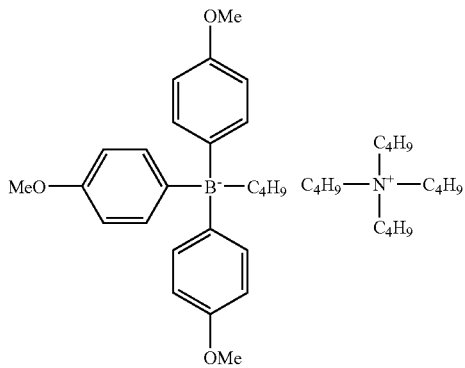
BS-15

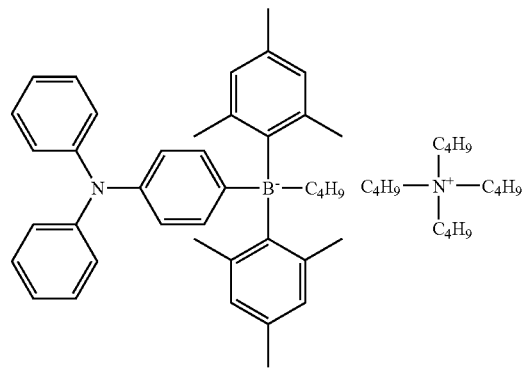
BS-16

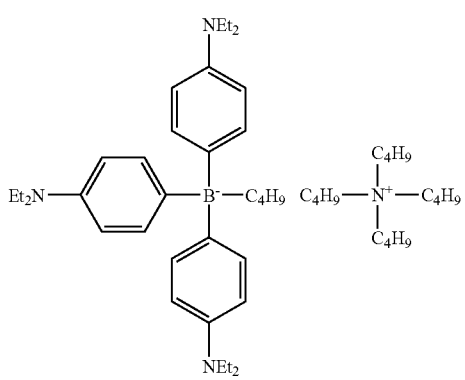
BS-17

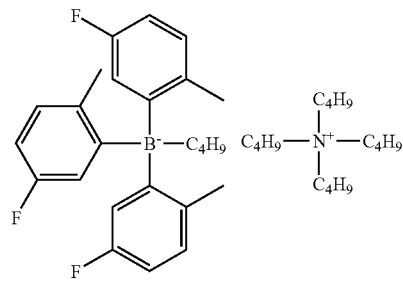

Various additives can be used together with the photoinitiator system to affect the polymerization rate. For example, a reducing agent such as an oxygen scavenger or a chain-transfer aid of an active hydrogen donor, or other compound can be used to accelerate the polymerization. An oxygen scavenger is also known as an autoxidizer and is capable of consuming oxygen in a free radical chain process. Examples of useful autoxidizers are N,N-dialkylanilines. Examples of preferred N,N-dialkylanilines are dialkylanilines substituted in one or more of the ortho-, meta-, or para-position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo. Representative examples of N,N-dialkylanilines useful in the present invention are 4-cyano-N,N-dimethylaniline, 4-acetyl-N,N-dimethylaniline, 4-bromo-N,N-dimethylaniline, ethyl 4-(N,N-dimethylamino)benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylaniline, N,N-dimethylthioanicidine 4-amino-N,N-dimethylaniline, 3-hydroxy-N,N-dimethylaniline, N,N,N',N'-tetramethyl-1,4-dianiline, 4-acetamido-N,N-dimethylaniline, 2,6-diisopropyl-N,N-dimethylaniline (DIDMA), 2,6-diethyl-N,N-dimethylaniline, N,N,2,4,6-pentamethylaniline (PMA) and p-t-butyl-N,N-dimethylaniline.

It may be preferable to use the photoinitiator in combination with a disulfide coinitiator. Examples of useful disulfides are described in U.S. Pat. No. 5,230,982 by Davis et al., which is incorporated herein by reference. Two of the most preferred disulfides are mercaptobenzothiazo-2-yl disulfide and 6-ethoxymercaptobenzothiazol-2-yl disulfide. In addition, thiols, thioketones, trihalomethyl compounds, lophine dimer compounds, iodonium salts, sulfonium salts, azinium salts, organic peroxides, and azides, are examples of compunds useful as polymerization accelerators.

Other additives which can be incorporated into the photopatternable coatings, either a photoresist or photopatternable deposition inhibitor used in making various structures according to the present process, include polymeric binders, fillers, pigments, surfactants, adhesion modifiers, and the like. To facilitate coating on the support and functional layers the photopatternable film composition is usually dispersed in a solvent to create a solution or slurry, and then the liquid is evaporatively removed, usually with heating, after coating. Any solvent can be employed for this purpose which is inert toward the film forming components and addenda of the photopatternable film.

It may be preferable to practice the invention with positive-working photopatternable materials. By way of example, U.S. Pat. No. 4,708,925 by Newman (hereby incorporated by reference) describes a positive-working photopatternable composition containing novolak phenolic resins, an onium salt, and a dye sensitizer. In this system, there is an interaction between alkali-soluble phenolic resins and onium salts which results in an alkali solvent resistance when it is cast into a film. Photolytic decomposition of the onium salt restores solubility to the resin. Unlike the quinine diazides which can only be poorly sensitized, if at all, onium salts can be readily sensitized to a wide range of the electromagnetic spectrum from UV to infrared (280 to 1100 nm).

Examples of compounds which are known to sensitize onium salts are those in the following classes: diphenylmethane including substituted diphenylmethane, xanthene, acridine, methine and polymethine (including oxonol, cyanine, and merocyanine) dye, thiazole, thiazine, azine, aminoketone, porphyrin, colored aromatic polycyclic hydrocarbon, p-substituted aminostyryl compound, aminotriazyl methane, polyarylene, polyarylpolyene, 2,5-diphenylisobenzofuran, 2,5-diarylcyclopentadiene, diarylfuran, diarylthiofuran, diarylpyrrole, polyaryl-phenylene, coumarin and polyaryl-2-pyrazoline. The addition of a sensitizer to the system renders it sensitive to any radiation falling within the absorption spectrum of the said sensitizer. Other positive-working systems are known to those skilled in the art.

In one embodiment, the deposition inhibitor material comprises an organosiloxane polymer. The organosiloxanes are defined generically to include compounds substantially comprising, within their chemical structure, a skeleton or moiety made up of alternate Si and O atoms, in which at least one, preferably two organic groups are attached to the Si atom on either side of the —O—Si—O— repeat units. The organic groups can have various substituents such as halogens, including fluorine. Most preferably the organic groups are independently substituted or unsubstituted alkyl, phenyl, or cycloalkyl groups having 1 to 6 carbon atoms, preferably 1 to 3 carbon atoms, preferably substituted or unsubstituted methyl.

Organosiloxane polymers are defined to include polymers, prepolymers, or macromonomers having at least 20 siloxane repeat units. Particularly preferred are deposition inhibitor materials that, after application onto the substrate, and any crosslinking or intermolecular reaction, are insoluble. Such organosiloxane polymers include random or block and/or crosslinked polymers.

Optionally, functional groups may be present on the organosiloxane polymer such as terminal groups (also referred to as endcaps). Crosslinking groups, and/or functional groups may also be present, for example, located on a side chain off a siloxane backbone.

Examples of organosiloxane polymers include, for example, poly(alkylsiloxane), poly(arylsiloxane), poly(alkylarylsiloxane), and poly(alkyl(aryl)siloxane), optionally having functional groups. Such functionalized poly(siloxanes) include epoxy-functionalized, carboxyl-functionalized, polyether-functionalized, phenol-functionalized, amino-functionalized, alkoxy-functionalized, methacryl-functionalized, carbinol-functionalized, hydroxy-functionalized, vinyl-functionalized, acrylic-functionalized, silane-functionalized, trifluoro-functionalized, or mercapto-functionalized poly(organosiloxanes). Block copolymers can also be employed if containing substantial siloxane repeat units. Such polymers can be prepared as described in numerous patents and publications or are commercially available from, for example, General Electric, Dow Corning, and Petrarch.

The preferred poly(organosiloxane) polymers, including random or block copolymers, comprise organic groups (attached to the silicon atoms) that are independently hydrogen, alkyl having from 1 to 18 carbons, such as methyl, ethyl, propyl, butyl, and the like; an aryl group having 6 to 18 carbons, preferably 6 to 8 carbon atoms, such as phenyl, benzyl, napthyl, and the like; a mercaptoalkyl group having from 1 to 18 carbons, such as mercaptopropyl; an aminoalkyl group having from 1 to 18 carbons, such as aminopropyl or aminoisopropyl; trifluoroalkyl having 1 to 18 carbons, such as trifluoromethyl; or trifluoroaryl having 6 to 18 carbons, such as trifluoromethylphenyl. The preferred weight average molecular weight range for the poly(organosiloxane) polymers, if not crosslinked, is 200 to 140,000, more preferably 4,000 to 120,000. Preferably, alkyl groups have 1 to 6 carbon atoms, more preferably 1 to 3 carbon atoms. A particularly preferred organosiloxane polymer comprises a vinyl terminated siloxane that is crosslinked.

Mixtures of organosiloxanes with a photopolymerizable matrix activated by visible radiation are preferable compositions for use in the present invention. Blends of organosiloxanes with cyclized rubber (poly cis-isoprene), a bis-azide (such as 2,6-bis(4-azidobenzal)-4-methylcyclohexanone) and a photosensitizer, are particularly preferred photopatternable compositions for use with the present invention, particularly when combined with an ALD selective deposition step. The sensitization of poly cis-isoprene resists to visible wavelengths has been described, for example, by J. Frejlich and R. Knoesel (Applied Optics, 18 8 1135-1136 (1979), using triplet sensitizers such as 9-fluorenone. In a preferred embodiment of the present invention, it is preferable to include an organosiloxane with the photopolymerizable composition forming a photopatternable deposition inhibitor.

Once a photopatternable deposition inhibitor layer is exposed, it can be developed by any means known the art. Development is the process by which the soluble portions of photopatternable deposition inhibitor layer are removed. Methods for developing typically include exposure to a selective solvent, heating, or combinations thereof. A liquid developer can be any convenient liquid which is capable of selectively removing the photopatternable layer based on exposure level. The exposed photopatternable layer can be sprayed, flushed, swabbed, soaked, sonicated, or otherwise treated to achieve selective removal. In its simplest form the liquid developer can be the same liquid employed as a solvent in coating the light curable film. In some instances the photoresist is not rendered soluble where it is ultimately to be removed, but is instead rendered susceptible to a particular reaction that occurs during exposure to a development solution which then permits solubility.

In patterning processes where the photopatterned deposition inhibitor layer film is not intended to be part of the final article, it needs to be removed after it has been used to successfully pattern an area. This removal can be accomplished with any means known in the art, included plasma treatments, especially plasmas including oxygen, solvent based stripping, and mechanical or adhesive means.

In many embodiments the photopatternable layer is simply a layer used to pattern another functional layer. However, circumstances may exist in which the light cured layer is also the functional layer. Examples of this are the use of a curable layer as a dielectric due to its insulating behavior, or as a structural element such as a small wall or microcell due to its mechanical properties. This use of photopatternable layers as functional layers is not limited to the above examples.

In the process for the article of this invention there is required a light source that emits light of some spectrum, the multicolor mask that contains at least two color records in which each is capable of absorbing light of some spectrum, and a photopatternable layer that is capable of responding to light of some spectrum.

The system can function in several modes:

(1) White light, defined as light of a very broad visible spectrum, can be used as the illumination source. In this case, it is required that the photopatternable layer have a sensitivity distribution that substantially matches the absorption spectrum of the target color record of the color mask. Substantially matching spectrum is defined as the integrated product of the two spectra, each normalized to an area of 1, exceeding 0.5, preferably exceeding 0.75, most preferably exceeding 0.9.

(2) Colored light, as defined by light of a narrow spectrum, can be used as the illumination source. In this case, the absorption spectrum of photopatternable layer can be made to substantially match the spectrum of the emitted light, or the absorption spectrum can be broad. The former case may be desirable for improved sensitivity of the photopatternable layer and reduced cross talk between layers, while the latter case may be desirable for allowing several process steps to employ a single photopatternable layer formulation.

In some cases it may be desirable to apply a black layer to part of the multicolor mask. Such a black layer has the property of absorbing substantially all of the light in those areas of the mask having the black layer. If, for example, large areas of the final product are desired to have no patterning, a black printed mask can be used in those areas.

In much of the preceding discussion the color mask is referred to as having color absorption corresponding to the traditional observable colors of the visible spectrum. However, this applies a limitation to the number of individual mask levels that can be accomplished with this approach. In principle a high number of individual color records can be used provided that each color record can be independently addressed in the process. In addition, by utilizing infrared and ultraviolet portions of the spectrum, the number of mask levels may further be increased. It is envisioned that upwards of 6 individual mask levels can be achieved with the current invention.

In this process, light passes through the multicolor mask and then through the previously applied functional layers on the front of the substrate. As a result, the light must pass through the previously applied layers with weak enough modulation as to not overly affect the resulting images formed on the applied light curable layers. The requirement for transparency of the applied functional layers is thus limited to having an acceptably low effect on the curable layer imaging process. In principle therefore, the previously applied can absorb light uniformly as long as this absorption is low, preferably having an optical density of less than 0.5. Furthermore, the materials can absorb very strongly but only in regions where the imaging chemistry is not being used, or where these spectral ranges have been used but in prior stages of the manufacture of the article. Furthermore, the final layer in the process can be of any opacity, since additional patterning is not required on top.

An aspect of this invention is the ability to at will use one of the colors of the multicolor mask to form a pattern on the front side of the item by the direction light through the substrate to cause an effect. A number of methods can be used to cause the patterning.

(a) A functional material can be coated uniformly over the multicolor mask of the item and then overcoated with a photopatternable resist material that hardens when it is exposed to light through the substrate. The hardened material is then more difficult to remove, so in a subsequent development step, the photopatternable resist is patterned to have openings where no light has struck. The item can then be exposed to a material that attacks the functional layer, thus removing it where no light has struck. This is a negative etch process. FIGS. 9A-9F illustrate how a multicolor mask is used in a negative etch patterning sequence.

(b) A functional material can be coated uniformly upon over the multicolor mask of the item and then overcoated with a photopatternable resist material that softens when it is exposed to light from the back side. The softened materials is then easier to remove, so in a subsequent development step, the resist is patterned to have openings where light has struck. The item can then be exposed to a material that attacks the functional layer, thus removing it where light has struck. This is a positive etch process. FIGS. 10A-10F illustrate how a multicolor mask is used in a positive etch patterning sequence.

(c) A photopatternable resist material can be coated followed by exposure and development step as outlined in (a) or (b). This will yield a resist pattern that has holes in it. This can then be overcoated with a uniform layer of a functional material. If the entire item is then treated with a material that attacks the remaining photoresist under the functional material, it can remove material where photoresist resides. This will leave functional material where there was originally no photoresist. This is a liftoff process. FIGS. 11A-11F illustrate how a multicolor mask is used in a liftoff patterning process.

(d) A number of deposition processes employing both liquids and vapor phase chemical delivery can be tailored to operate in a manner where material selectively deposits only in certain areas. For example, a photopatternable resist material can be coated followed by exposure and development step as outlined in (a) or (b). Next, a deposition process that leads to material being deposited only in those regions where no resist material remains. The entire item is then treated with a material or process that attacks the remaining resist. The material or process may remove the remaining resist or leave it in a benign form for future process steps. This is selective deposition. FIG. 12A-12H illustrate how a multicolor mask can be used in the present invention using a selective deposition patterning process.

A support can be used for supporting the device during manufacturing, testing, and/or use. As used in this disclosure, the terms "support" and "substrate" may be used interchangeably. The skilled artisan will appreciate that a support selected for commercial embodiments may be different from one selected for testing or screening various embodiments. In some embodiments, the support does not provide any necessary electrical function for the device. This type of support is termed a "non-participating support" in this document. Useful materials can include organic or inorganic materials. For example, the support may comprise inorganic glasses, ceramic foils, polymeric materials, filled polymeric materials, acrylics, epoxies, polyamides, polycarbonates, polyimides, polyketones, poly(oxy-1,4-phenyleneoxy-1,4-phenylenecarbonyl-1,4-phenylene) (sometimes referred to as poly (ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP).

A flexible support is used in some embodiments. This allows for roll-to-roll or roll-to-sheet processing, which may be continuous, providing economy of scale and economy of manufacturing over flat and/or rigid supports. The flexible support chosen preferably is capable of wrapping around the circumference of a cylinder of less than about 50 cm diameter, more preferably 25 cm diameter, most preferably 10 cm diameter, without distorting or breaking, using low force as by unaided hands. The preferred flexible support may be rolled upon itself.

If flexibility is not a concern, then the substrate may be a wafer or sheet made of materials including glass as well as any other transparent material.

The thickness of the substrate may vary, and according to particular examples it can range from about 10 µm to about 1 mm. Preferably, the thickness of the substrate is in the range from about 10 µm to about 300 µm. Provided the exposing light source is sufficiently collimated to limit the angular spread of light through the support layer, even thicker substrates can be tolerated. Particularly for embodiments where a portion of the multicolor mask is on the back side of the support, it may be advantageous, for optical considerations, to coat or cast the main support layer directly onto the color absorbing layers of the second portion of the multicolor mask. In some embodiments, such a support is optional, particularly when a support layer is a functional layer or a color absorbing layer of the multicolor mask.

In addition, the multicolor mask and support may be combined with a temporary support. In such an embodiment, a support may be detachably adhered or mechanically affixed to the multicolor mask.

Any material that can form a film on the substrate can be patterned with this invention, as long as the appropriate etching and or deposition conditions are chosen. General classes of functional materials that can be used include conductors, dielectrics or insulators, and semiconductors. Functional materials of the present invention may be deposited in using any convenient method. Typical deposition processes include chemical vapor deposition, sputtering, evaporation, thermal transfer or solution processing. One embodiment of the current invention, the functional materials are applied using gravure or inkjet. In another embodiment the functional material is deposited using Atomic Layer Deposition (ALD). In a preferred embodiment of the present invention, the functional material is deposited by an ALD system consisting of a gas distribution manifold having a plurality of openings through which first and second reactive gases flow as the manifold and the substrate move relative to each other. Co-pending, commonly assigned US Patent Publication No. 2007/0238311 describes such a method in detail and the disclosure of which is hereby incorporated in its entirety by reference.

Conductors as functional materials can be any useful conductive material. A variety of conductor materials known in the art, are also suitable, including metals, degenerately doped semiconductors, conducting polymers, and printable materials such as carbon ink, silver-epoxy, or sinterable metal nanoparticle suspensions. For example, the conductor may comprise doped silicon, or a metal, such as aluminum, chromium, gold, silver, nickel, copper, tungsten, palladium, platinum, tantalum, and titanium. Conductors can also include transparent conductors such as indium-tin oxide (ITO), ZnO, $SnO_2$, or $In_2O_3$. Conductive polymers also can be used, for example polyaniline, poly(3,4-ethylenedioxythiophene)/poly(styrene sulfonate) (PEDOT:PSS). In addition, alloys, combinations, and multilayers of these materials may be most useful.

The thickness of the conductor may vary, and according to particular examples it can range from about 5 to about 1000 nm. The conductor may be introduced into the structure by chemical vapor deposition, sputtering, evaporation and/or doping, or solution processing.

A dielectric electrically insulates various portions of a patterned circuit. A dielectric layer may also be referred to as an insulator or insulating layer. The dielectric should have a suitable dielectric constant that can vary widely depending on the particular device and circumstance of use. For example, a dielectric constant from about 2 to 100 or even higher is known for a gate dielectric. Useful materials for a dielectric may comprise, for example, an inorganic electrically insulating material. Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these examples can be used as a dielectric. Of these materials, aluminum oxides, silicon oxides, and silicon nitride are useful. The dielectric may comprise a polymeric material, such as polyvinylidenedifluoride (PVDF), cyanocelluloses, polyimides, polyvinyl alcohol, poly(4-vinylphenol), polystyrene and substituted derivatives thereof, poly (vinyl naphthalene) and substituted derivatives, and poly (methyl methacrylate) and other insulators having a suitable dielectric constant. The gate electric may comprise a plurality of layers of different materials having different dielectric constants.

The thickness of a dielectric layer may vary, and according to particular examples it can range from about 15 to about 1000 nm. The dielectric layer may be introduced into the structure by techniques such as chemical vapor deposition, sputtering, atomic layer deposition, evaporation, or a solution process.

Semiconductors used in this system may be organic or inorganic. Inorganic semiconductors include classes of materials exhibiting covalently bonded lattices, and may also include amorphous materials where the lattice exhibits only short range order. Examples of useful semiconducting materials are single elements such as silicon or germanium, and compound semiconductors such as gallium arsenide, gallium nitride, cadmium sulfide, and zinc oxide. Useful organic semiconductors include linear acenes such as pentacenes, naphthalenediimides such as those described in co-pending patent applications, perylenediimides, polythiophenes, polyfluorenes.

In typical applications of a thin film transistor, the desire is for a switch that can control the flow of current through the device. As such, it is desired that when the switch is turned on a high current can flow through the device. The extent of current flow is related to the semiconductor charge carrier mobility. When the device is turned off, it is desired that the current flow be very small. This is related to the charge carrier concentration. Furthermore, it is desired that the device be weakly or not at all influenced by visible light. In order for this to be true, the semiconductor band gap must be sufficiently large (>3 eV) so that exposure to visible light does not cause an inter-band transition. A material that is capable of yielding a high mobility, low carrier concentration, and high band gap is ZnO.

The entire process of making the thin film transistor or electronic device of the present invention, or at least the production of the thin film semiconductor, is preferably carried out below a maximum support temperature of about 200° C., more preferably below 150° C., most preferably below about 140° C., and even more preferably below about 100° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports and the multicolor mask. Thus, the invention enables production of relatively inexpensive circuits containing thin film transistors.

Electronically or optically active layers may be formed and doped using solution processes, vacuum vapor deposition techniques, or atmospheric vapor deposition processes such as those described in co-pending Patent Publication Nos. 2007/0228470 and 2007/0238311.

The patterning methods of this invention are preferably used to create electrically and optically active components that are integrated on a substrate of choice. Circuit components can comprise transistors, resistors, capacitors, conductors, inductors, diodes, and any other electronics components that can be constructed by selecting the appropriate patterning and materials. Optically functional components can comprise waveguides, lenses, splitters, diffusers, brightness enhancing films, and other optical circuitry. Structural components can comprise wells, selective patterns of fillers and sealants, patterned barrier layers, walls and spacers.

Electronic devices in which TFTs and other devices are useful include, for example, more complex circuits, e.g., shift registers, integrated circuits, logic circuits, smart cards, memory devices, radio-frequency identification tags, backplanes for active matrix displays, active-matrix displays (e.g. liquid crystal or OLED), solar cells, ring oscillators, and complementary circuits, such as inverter circuits, for example, in which a combination of n-type and p-type transistors are used. In an active matrix displays, a transistor made according to the present invention can be used as part of voltage hold circuitry of a pixel of the display. In such devices, the TFTs are operatively connected by means known in the art.

One example of a microelectronic device is an active-matrix liquid-crystal display (AMLCD). One such device is an optoelectronic display that includes elements having electrodes and an electro-optical material disposed between the electrodes. A connection electrode of the transparent transistor may be connected to an electrode of the display element, while the switching element and the display element overlap one another at least partly. An optoelectronic display element is here understood to be a display element whose optical properties change under the influence of an electrical quantity such as current or voltage such as, for example, an element usually referred to as liquid crystal display (LCD). The presently detailed transistor has sufficient current carrying capacity for switching the display element at such a high frequency that the use of the transistor as a switching element in a liquid crystal display is possible. The display element acts in electrical terms as a capacitor that is charged or discharged by the accompanying transistor. The optoelectronic display device may include many display elements each with its own transistor, for example, arranged in a matrix. Certain active matrix pixel designs, especially those supplying a display effect that is current driven, may require several transistors and other electrical components in the pixel circuit.

EXAMPLES

The following non-limiting examples further describe the practice of the instant invention.

A. Visible Light Curable Film Components

The following materials and coating solutions were used to prepare the visible light curable films. Stock solution CF-1 contained two grams of polymethylmethacrylate (PMMA) (MW ~75K), 6.5 g of trimethylolpropane triacrylate, and 20 g of anisole. Stock solution CF-2 contained 1.5 grams of ethoxylated trimethylolpropane triacrylate (SR9035 purchased from Sartomer Company, Inc.) and 1.5 g of polyethylene glycol diacrylate (SR610 purchased from Sartomer Company, Inc.) in 4 g of ethanol. Stock solution CF-3 was a commercial resist CT2000L supplied by Fuji Photochemicals containing a methacrylate derivative copolymer and polyfunctional acrylate resin in a mixture of 2-propanol-1-methoxyacetate and 1-ethoxy-2-propanol acetate. Stock solution CF-4 contained 1.25 g of a Novolak resin, and 0.2 g of Irgacure 250 (purchased from CIBA Specialty Chemicals), in MEK. Stock solution CF-5 was a positive-working commercial resist SC-1827, (purchased from Rohm and Haas Electronic Materials). Stock solution CF-6 was prepared as follows.

DEHESIVE 944 is a vinyl-terminated dimethylsiloxane polymer supplied by Wacker Chemie AG. Crosslinker V24 is a methylhydrogenpolysiloxane supplied by Wacker. Catalyst OL is an organoplatinum complex in polydimethylsiloxane, also supplied by Wacker. Crosslinker V24 and Catalyst OL are used for additional curing of vinyl-terminated siloxane polymers such as DEHESIVE 944. Stock solution CF-6 was prepared which contained 3.3 g of a 1% solution of polymethylmethacrylate dissolved in toluene, 0.5 g of a 10% solution of TMPTA in toluene, 0.25 g of a 0.1% solution of Photoinitiator A in anisole, 0.5 g of a solution containing 1.08% DEHESIVE 944, 0.002% Crosslinker V24, and 0.06% Catalyst OL in a mixture of 33 parts toluene and 48 parts heptane, and 0.85 g of toluene. Stock solution CF-7 was prepared as follows. A dehesive solution was prepared containing 0.108% DEHESIVE 944, 0.0002% Crosslinker V24, and 0.006% Catalyst OL in a mixture of 33 parts toluene and 48 parts heptane. Stock solution CF-7 contained 1.25 g of HNR-80, 23.75 g of toluene, and 0.5 g of the dehesive solution.

The stock solutions CF1-CF4 were sensitized to visible light by addition of a dye photoinitiator. Photoinitiator structures appear in Table 1. Photoinitiator solutions were prepared as follows. YPI-1 was a 1% solution of yellow photoinitiator A in anisole. YPI-2 was a 1% solution of yellow photoinitiator A in ethanol. YPI-3 was a 1% solution of yellow photoinitiator A in cyclohexanone. MPI-1 was a 1% solution of magenta photoinitiator B in anisole. MPI-2 was a 1% solution of magenta photoinitiator B in ethanol. MPI-3 was a 1% solution of magenta photoinitiator in cyclohexanone. CPI-1 was a 1% solution of cyan photoinitiator C in anisole. CPI-2 was a 1% solution of photoinitiator C in ethanol. CPI-3 was a 1% solution of photoinitiator C in cyclohexanone.

Stock solution CF-7 was sensitized to visible light by addition of spectral sensitizing solution F-1. Spectral sensitizer solution F-1 was a 1% solution of spectral sensitizer 9-fluorenone dissolved in xylene.

Developer solution D-1 was MIBK. Developer solution D-2 was ethanol. Developer solution D-3 was an aqueous solution containing 0.002 M tetramethylammonium hydroxide and 0.002 M diethanolamine. Developer solution D-4 was Microposit™ MF™-319, purchased from Rohm and Haas Electronic Materials. Developer solution D-5 was WNRD, obtained from Fujifilm Electronic Materials.

TABLE 1

| | Dye | λmax |
|---|---|---|
| Photoinitiator A | 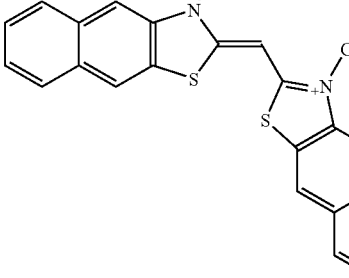 | 450 nm |
| Photoinitiator B | 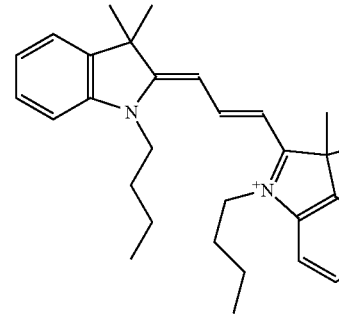 | 555 nm |
| Photoinitiator C | 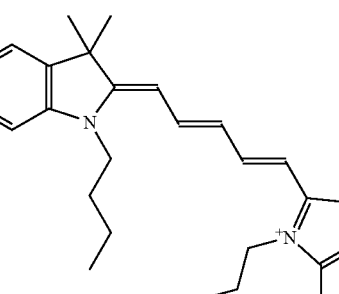 | 645 nm |

B. Electronic Materials Deposition and Patterning

The following solutions were used to etch the functional materials. E-1 was a 50/50 mixture of HCl and water. E-2 was Microposit™ MF™-319 Developer purchased from Rohm and Haas Electronic Materials. Subbing layer S-1 was a 7.5% solution of polycyanoacrylate in a 50/50 mixture of acetonitrile and cyclopentanone. S-2 was Omnicoat™, purchased from MicroChem.

C. Electrical Characterization of Transistor Structures

Electrical characterization of the fabricated devices was performed with a Hewlett Packard HP 4156® parameter analyzer. Device testing was done in air in a dark enclosure.

The results were averaged from several devices. For each device, the drain current (Id) was measured as a function of source-drain voltage (Vd) for various values of gate voltage (Vg). Furthermore, for each device the drain current was measured as a function of gate voltage for various values of source-drain voltage. Vg was swept from minus 10 V to 40 V for each of the drain voltages measured, typically 5 V, 20 V, and 35 V, and 50 V. Mobility measurements were taken from the 35V sweep.

Parameters extracted from the data include field-effect mobility (μ), threshold voltage (Vth), subthreshold slope (S), and the ratio of Ion/Ioff for the measured drain current. The field-effect mobility was extracted in the saturation region, where Vd>Vg−Vth. In this region, the drain current is given by the equation (see Sze in *Semiconductor Devices—Physics and Technology*, John Wiley & Sons (1981)):

$$I_d = \frac{W}{2L}\mu C_{ox}(V_g - V_{th})^2$$

where, W and L are the channel width and length, respectively, and $C_{ox}$ is the capacitance of the oxide layer, which is a function of oxide thickness and dielectric constant of the material. Given this equation, the saturation field-effect mobility was extracted from a straight-line fit to the linear portion of the $\sqrt{I_d}$ versus Vg curve. The threshold voltage, $V_{th}$, is the x-intercept of this straight-line fit.

Example 1

Multicolor Mask Formed by Direct Printing Process

In this example, a multicolor mask was prepared containing three color absorbing layers, with each color corresponding to an individual functional layer of an array of thin film transistor devices. The design for the gate layer of the array of thin film transistor devices was converted into a black and white bitmap file. The design for the semiconductor layer of the array of thin film transistor devices was converted into another black and white bitmap file. The design for the source and drain layer of the array of thin film transistor device was converted into a third black and white bitmap file. These bitmaps were then imported into the blue channel, green channel, and red channel of a single color image file using Photoshop 6.0. In this full color image, the blue channel contained the gate layer design as a yellow pattern. The green channel contained the semiconductor layer design as a magenta pattern. The red channel contained the source and drain design as a cyan pattern. This color image was printed onto a transparent support using a Kodak Professional 8670 Thermal Printer loaded with Kodak Professional Ektatherm XLS transparency media. The resulting multicolor mask was laminated to the nonconductive side of a flexible ITO film purchased from Bekaert Specialty films.

Example 2

Multicolor Mask Formed by Photolithography Process

In this example, a multicolor mask was prepared containing three color absorbing layers, with each color corresponding to an individual functional layer of an array of thin film transistor devices. Chrome on glass masks for the gate layer (CG-1), semiconductor and dielectric layers (CG-2), and source and drain layers (CG-3) of the array of thin film transistor devices were obtained from Applied Image Incorporated. A 0.7 mm thick borosilicate glass support was washed for 10 minutes by treating with a solution of 70% sulfuric acid and 30% of a 30% solution of hydrogen peroxide maintained at approximately 100° C. After washing, the clean glass was spin coated (at 1000 RPM) with Color Mosaic SC3200L (purchased from Fujifilm Electronic Materials Co., Ltd.). SC-3200L is a UV curable photoresist containing 3-5% of a cyan pigment, 7-9% of a methacrylate derivative copolymer, 7-9% of a polyfunctional acrylate resin and a UV photosensitizer dispersed in a mixture of propylene glycol monomethyl ether acetate and ethyl-3-ethoxy-propionate.

The coated glass slide was baked for 1 minute at 95° C., and exposed for 1 minute to a pattern of UV light using a 200 W Mercury-Xenon lamp, with mask CG-3 (contact exposure). The cyan photoresist layer was developed for one minute with a solution of 0.03 M tetramethylammonium hydroxide/0.03 M diethanolamine in water, rinsed with water, and baked for 5 minutes at 200° C.

The sample was then spin coated (at 1000 RPM) with Color Mosaic SM3000L (purchased from Fujifilm Electronic Materials Co., Ltd.). SM-3000L is a UV curable photoresist containing 4-6% of a magenta pigment, 6-8% of a methacrylate derivative copolymer, 6-8% of a polyfunctional acrylate resin and a UV photosensitizer dispersed in a mixture of propylene glycol monomethyl ether acetate and ethyl-3-ethoxy-propionate. The coated glass slide was baked for 1 minute at 95° C., and exposed for 1 minute to a pattern of UV light using a 200W Mercury-Xenon lamp, with mask CG-2 (contact exposure). The magenta photoresist layer was developed for one minute with a solution of 0.03 M tetramethylammonium hydroxide/0.03 M diethanolamine in water, rinsed with water, and baked for 5 minutes at 200° C. The resulting glass substrate contained an array of registered cyan and magenta patterns. The sample was then spin coated (at 1000 RPM) with Color Mosaic SY3000L, (purchased from Fujifilm Electronic Materials Co., Ltd.). SY-3000L is a UV curable photoresist containing 3-5% of a yellow pigment, 7-9% of a methacrylate derivative copolymer, 7-9% of a polyfunctional acrylate resin and a UV photosensitizer dispersed in a mixture of propylene glycol monomethyl ether acetate and ethyl-3-ethoxy-propionate. The coated glass slide was baked for 1 minute at 95° C., and exposed for 1 minute to a pattern of UV light using a 200 W Mercury-Xenon lamp, with mask CG-1 (contact exposure). The yellow photoresist layer was developed for one minute with a solution of 0.03 M tetramethylammonium hydroxide/0.03 M diethanolamine in water, rinsed with water, rinsed with water, and baked for 5 minutes at 200° C. The resulting multicolor mask contained an array of registered cyan, magenta, and yellow patterns.

Example 3

Blue-Curable Film Formulation

A coating solution C-1 for the blue light curable film was prepared as follows. A solution of blue sensitive photoinitiator was prepared by adding 0.03 g of photoinitiator A to 3 grams of toluene.

Photoinitiator A:

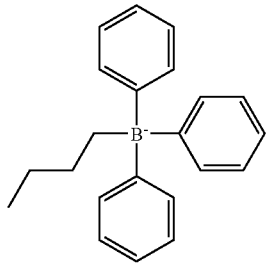

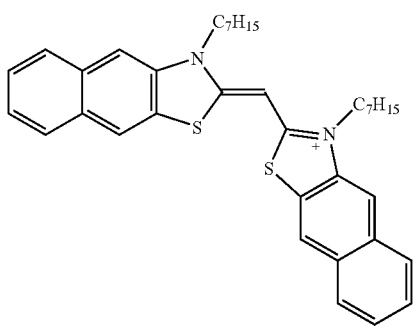

In a separate vial, five grams of polymethylmethacrylate (PMMA) (MW ~75K) were dissolved in 45 g of anisole. To 2.9 g of the resulting PMMA solution, 0.95 g of trimethylolpropane triacrylate and 0.5 g of the solution of photoinitiator A were added.

Green-Curable Film Formulation:

A coating solution C-2 for the green light curable film was prepared as follows. A solution of green sensitive photoinitiator was prepared by adding 0.03 g of photoinitiator B to 3 grams of anisole. In a separate vial, five grams of PMMA (MW ~75K) were dissolved in 45 g of anisole. To 2.9 g of the resulting PMMA solution, 0.95 g of trimethylolpropane triacrylate and 0.5 g of the solution of photoinitiator B were added.

Photoinitiator B:

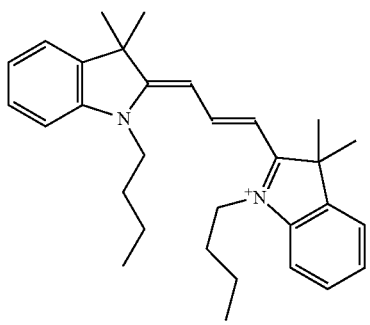

-continued

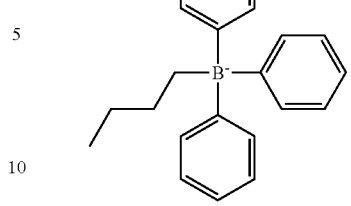

Example 4

Red-Curable Film Formulation

A coating solution C-3 for the red light curable film was prepared as follows. A solution of red sensitive photoinitiator was prepared by adding 0.025 g of photoinitiator C to 2.5 grams of anisole. In a separate vial, five grams of PMMA (MW ~75K) were dissolved in 45 g of anisole. To 2.9 g of the resulting PMMA solution, 0.95 g of trimethylolpropane triacrylate and 0.5 g of the solution of photoinitiator C were added.

Photoinitiator C:

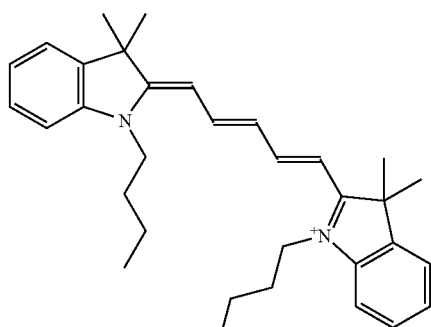

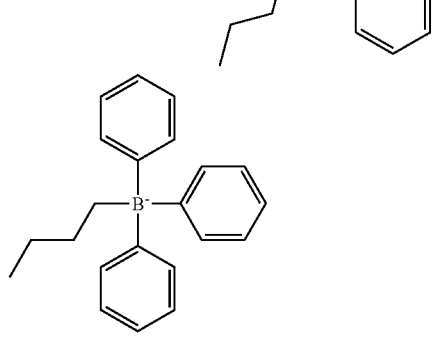

Example 5

Registered Conductive Layer Patterns on Flexible Film with Single Multicolor Mask The multicolor mask resulting from Example 1 was laminated to the nonconductive side of a flexible ITO film purchased from Bekaert Specialty films. The conductive side was coated with blue-curable coating solution C-1 by spin coating at a rate of 1000 RPM. The sample was baked for 1 minute at 80° C., and loaded in a glass cell purged with nitrogen. The sample was illuminated for ⅛" using a 300 W GE Mini Multi-Mirror FHS projection lamp in such fashion that illuminating light passes through the multicolor mask before reaching the blue-curable coating. Uncured portions of the blue-curable coating were removed by developing for 30 seconds in methylisobutylketone (MIBK). These steps resulted in formation of a patterned polymer film in registry with the yellow pattern on the color-encoded mask. The ITO layer was etched in HCl:H$_2$O (1:1) to remove portions of the ITO not covered by the blue-light cured film. Portions of the ITO protected by the pattern of blue-light cured film remained, resulting in a patterned ITO layer and a patterned polymer film in registry with the yellow pattern on the multicolor mask. The sample was then spin coated with solution of silver nanoparticles and annealed at 110° C. The resulting semitransparent conductive film had a neutral density of 0.6. The silver nanoparticulate layer was coated with red-curable coating solution C-3 by spin coating at a rate of 1000 RPM. The sample was baked for 1 minute at 80° C. and exposed for 2" using the exposure method previously described. The sample was illuminated for 2" in such fashion that illuminating light passed through the multicolor mask, flexible film, patterned ITO layer, and silver nanoparticle layer before reaching the red-curable coating. Unexposed portions of the red-curable coating were removed by developing for 30 seconds in MIBK. These steps resulted in formation of a patterned polymer film in registry with the cyan pattern on the color-encoded mask. The silver layer was etched for 30 seconds using Kodak Ektacolor RA-4 bleach-fix solution to produce a patterned silver conductive film and a patterned red-cured polymer film in registry with the cyan pattern of the multicolor mask, a patterned blue-cured polymer film and a patterned ITO conductive film in registry with the yellow pattern of the multicolor mask.

Example 6

Thin Film Transistor

In this example, thin film transistors were prepared using a multicolor mask to pattern transparent electronic materials.

The first step in fabricating the transistors was to prepare the multicolor mask in the identical fashion described in Example 1. This mask was laminated to the nonconductive side of a piece of ITO glass. The conductive side was coated with blue-curable coating solution C-1 by spin coating at a rate of 1000 RPM. The sample was baked for 1 minute at 80° C., and loaded in a glass cell purged with nitrogen. The sample was illuminated for ⅛" using a 300 W GE Mini Multi-Mirror FHS projection lamp in such fashion that illuminating light passes through the multicolor mask before reaching the blue-curable coating. Uncured portions of the blue-curable coating were removed by developing for 30 seconds in MIBK. These steps resulted in formation of a patterned polymer film in registry with the yellow pattern on the color-encoded mask, forming a series of stripes. The ITO layer was etched for 7 minutes in HCl:H2O (1:1) to remove portions of the ITO not covered by the blue-light cured film, forming a series of conducting gate lines. Portions of the ITO protected by the pattern of blue-light cured film remained, resulting in a patterned ITO layer and a patterned polymer film in registry with the yellow pattern on the multicolor mask. The mask layers were removed and an aluminum oxide film was deposited on the patterned ITO layer using a CVD process with trimethylaluminum and water as reactive materials entrained in a nitrogen carrier gas. Subsequently, a zinc oxide film was deposited using a CVD process and utilizing diethyl zinc and water as reactive materials entrained in a nitrogen carrier gas. To facilitate electrical contact to the ITO gate lines, the aluminum oxide and zinc oxide films did not cover the top 5 mm of the sample area. Metal source and drain contacts were deposited using vacuum evaporation through a shadow mask. Typical electrodes were of a size leading to a channel that was 480 microns wide by about 50 microns long, although due to small channel length variations mobilities were calculated using individually measured lengths. Devices were then tested for transistor activity. The transistors prepared using the multicolor mask yielded a mobility of 0.8 cm$^2$/V-s.

The fabrication sequence employing a multicolor mask as outlined above allows for accurate placement of any number of transparent functional layers on the substrate even while exposing the substrate to varying temperature and solvent treatments. Further, even for large area substrates, there are no issues with dimensional distortion of the substrate or mechanical alignment errors leading to cumulative and catastrophic alignment errors. Use of the multicolor mask and visible light curable films provides a unique solution to the registration challenge without the need for expensive alignment equipment and processes.

Example 7

Multicolor Mask Formed by Photolithography Process

In this example a multicolor mask MM-2 was prepared containing three color absorbing layers RCA-2, GCA-2, and BCA-2 and planarizing layer P-2, with each color corresponding to an individual functional layer of an array of thin film transistor devices. This mask was prepared in the same way as the mask described for Example 2, with the exception that laser-written molybdenum masks were prepared for the gate layer (CG-1), semiconductor and dielectric layers (CG-2), and source and drain layers (CG-3) of the array of thin film transistor devices. In addition, the desired functional layers were encoded into different color records in this mask than was used for Example 2. That is, red color absorbing layer RCA-2 was prepared using the cyan photoresist SC32000L and exposed using mask CG-1. Green color absorbing layer GCA-2 was prepared using the magenta photoresist SM3000L, and exposed using mask CG-3. Blue color absorbing layer was prepared using yellow photoresist SY3000L, and exposed using mask CG2. The resulting sample was then spin coated (at 1000 RPM) with clear photoresist CT2000L, exposed to UV light and baked for 5 minutes at 200° C.

The resulting multicolor mask MM-2 contained an array of registered cyan (RCA-2), magenta (GCA-2), and yellow (BCA-2) patterns and a clear planarizing layer P-2. The absorbance and peak wavelength of the individual color absorbing layers in MM-2 is shown in Table 2 below. The Optical Density (Status M) to red light (cyan OD), green (magenta OD), and blue light (yellow OD) and peak wavelength of the individual color absorbing layers in MM-2 is shown in Table 2 below.

TABLE 2

| | Optical Density (Status M) | | | |
| --- | --- | --- | --- | --- |
| | Cyan OD | Magenta (OD) | Yellow (OD) | λmax |
| BCA-2 | 0.03 | 0.05 | 0.97 | 465 nm |
| GCA-2 | 0.05 | 1.02 | 0.18 | 565 nm |
| RCA-2 | 0.94 | 0.13 | 0.05 | 625 nm |

Example 8

In this set of examples (C4-C12), multicolor mask MM-2 is used in combination with blue, green, and red-sensitive coatings, to produce distinct photopatterns of deposition inhibiting material.

Photopatternable deposition inhibitor coatings C4-C6 were prepared in the following manner. Coating solutions contained 4 g of CF-3 and 0.5 g of the photoinitiator solution indicated in Table 3 below. The coating solution was spin coated at 2000 RPM for one minute and dried for 2 minutes at 90° C., loaded in a glass cell purged with nitrogen, and exposed in such fashion that exposing light passed through the support and multicolor mask MM-2 before reaching the photosensitive coating. The coatings were developed using developer solution D-3. These steps resulted in formation of a negative patterned polymer film corresponding to a specific a color pattern on the multicolor mask. Results are summarized in Table 3 below. In example C-4, the photopattern produced corresponded to the blue color absorber pattern BCA-2, establishing that this coating formulation is a negative-working, blue sensitive film. In example C-5, the photopattern produced corresponded to the green color absorber pattern GCA-2, establishing that this coating is a negative-working, green sensitive film. In example C-6, the photopattern produced corresponded to the red color absorber pattern RCA-2, establishing that this formulation is a negative-working, red sensitive film.

Photopatternable deposition inhibitor coatings C7-C9 contained 7 g of CF-2 and 0.6 g of the photoinitiator solution indicated in Table 3. These solutions were coated, exposed, and developed in the same manner as for examples C4-C6, with the exception that these coatings were developed using developer solution D-2. These steps resulted in formation of a negative patterned deposition inhibitor film corresponding to a specific a color pattern on the multicolor mask, as indicated in Table 3. Coating C10 was exposed using blue light and developed using D-4, forming a positive resist image corresponding to BCA-2.

Photopatternable deposition inhibitor coating C-11 sensitive to blue light was prepared in the following manner. One gram of CF-6 was diluted with 5 g of toluene. The solution was spin coated at 2000 RPM, baked at 80° C. for one minute, exposed and developed using developer D-1, forming a negative resist image corresponding to BCA-2.

Photopatternable deposition inhibitor coating C-12 sensitive to blue light was prepared in the following manner. To 7.65 g of CF-7, 0.06 g of F-1 were added. The resulting solution was spin coated at 2000 RPM for 1 minute, baked at 90° C. for 1 minute, exposed with blue light and developed using developer D-5, rinsed with OCG Rinse, obtained from Fujifilm Electronic Materials, forming a negative resist image corresponding to BCA-2.

TABLE 3

| Example | Stock Solution | Photoinitiator | Exposing light | Photopattern obtained |
|---|---|---|---|---|
| C-4 | CF-3 | YPI-3 | Blue | BCA-2/negative |
| C-5 | CF-3 | MPI-3 | Green | GCA-2/negative |
| C-6 | CF-3 | CPI-3 | Red | RCA-2/negative |
| C-7 | CF-2 | YPI-2 | Blue | BCA-2/negative |
| C-8 | CF-2 | MPI-2 | Green | GCA-2/negative |
| C-9 | CF-2 | CPI-2 | Red | RCA-2/negative |
| C-10 | CF-5 | As purchased | Blue | BCA-2/positive |
| C-11 | CF-6 | YPI-1 | Blue | BCA-2/negative |
| C-12 | CF-7 | F-1 | Blue | BCA-2/negative |

Examples 9-13

Materials Patterning by Selective Deposition Process

In these examples, a multicolor mask prepared according to the procedure described for Example 7 was used in combination with visible-light sensitive coating to pattern a materials in selective deposition processes. Because the colorants in the_multicolor mask are spectrally distinct, the desired pattern for the zinc oxide layer was addressed simply by using an appropriate dye photoinitiator and color of exposing light.

Example 9

ZnO Selective Deposition

A photopatternable coating sensitive was prepared, exposed, and developed according to the procedure described for coating C-4 above. These steps resulted in formation of a negative patterned polymer film corresponding to the blue absorber pattern in the multicolor mask. After the photosensitive coating was developed, a zinc oxide coating was selectively deposited on regions not masked by the photopatterned deposition inhibitor. The device used to prepare ZnO layer has been described in detail in U.S. patent application Ser. No. 11/627,525, hereby incorporated by reference in its entirety. A 200-Angstrom thick zinc oxide coating was applied using this ALD coating device with diethyl zinc and water as reactive materials entrained in a nitrogen carrier gas. Ellipsometry data indicated the ZnO was selectively deposited on regions not masked by the photopatterned coating.

Example 10

ZnO Selective Deposition

A photopatternable coating sensitive to blue light was prepared, exposed, and developed according to the procedure described for coating C-12 above. After the photosensitive coating was developed, a zinc oxide coating was selectively deposited on regions not masked by the photopatterned deposition inhibitor, using the same coating device as for Example 9. For simplicity of reporting, the inhibition power is defined as the layer thickness at or below which there is substantially no thin film formed on the deposition inhibitor surface. Ellipsometry data indicated the photopatternable coating C-12 had an inhibition power of 850 Angstroms.

Example 11

Alumina Selective Deposition

A photopatternable coating sensitive to blue light was prepared, exposed, and developed according to the procedure described for coating C-11 above. These steps resulted in formation of a negative patterned polymer film corresponding to the blue absorber pattern in the multicolor mask, establishing that this coating formulation is a negative-working, blue sensitive film. After the photosensitive coating was developed, an aluminum oxide coating was selectively deposited on regions not masked by the photopatterned deposition inhibitor. The alumina film was deposited using the same coating device as for Example 9, except dimethylaluminum isopropoxide and water were used as reactive materials entrained in a nitrogen carrier gas. Ellipsometry data indicated the photopatterned layer had an inhibition power of 500 Angstroms.

Examples 12

Selective Deposition of Conducting Film

A photopatternable coating sensitive to green light was prepared, exposed, and developed according to the procedure described for Example C-8 above. These steps resulted in formation of a negative patterned polymer film corresponding to a specific a green-absorbing color pattern on the multicolor mask. A layer of silver nanoparticle ink (purchased from Cabot, Albuquerque, N. Mex.) was selectively applied using an inkjet printer, the sample was annealed to form a conducting patterned film. Optical micrographs clearly showed the silver pattern formed corresponded to the green color absorbing pattern, without "spillage" onto the top surface of the photopatterned coating.

Example 13

Selective Area Deposition of Alumina Layer

A photopatternable coating sensitive to blue light was prepared, exposed, and developed according to the procedure described for coating C-12 above. After the photosensitive coating was developed, an aluminum oxide coating was selectively deposited on regions not masked by the photopatterned deposition inhibitor, using the same coating device as for Example 9. For simplicity of reporting, the inhibition power is defined as the layer thickness at or below which there is substantially no thin film formed on the deposition inhibitor surface. Ellipsometry data indicated the photopatternable coating C-12 had an inhibition power of 800 Angstroms.

Example 14

Thin Film Transistor by Selective Area Deposition

The first step in fabricating the transistors was to prepare the multicolor mask using the same procedure employed to fabricate multicolor mask MM-2. In this color mask, the cyan color absorber pattern was a negative of the desired TFT gate pattern. The blue color absorber pattern was a positive of the desired TFT gate dielectric and semiconductor pattern. The green color absorber was a negative of the desired TFT source/drain/bussing pattern. The sample was coated with 1000 Angstroms of sputtered indium-tin-oxide. The ITO gate was patterned using red-sensitive photopatternable material, employing the coating, exposing, develop, procedure described for Example C-6, etched in E-1, rinsed, and dried. Residual photosensitive material was removed from the sample in an acetone bath and an oxygen plasma treatment. The sample was then coated with 1000 Angstroms of aluminum oxide A-2 applied using an atmospheric pressure deposition process. The aluminum oxide dielectric material was patterned using blue-sensitive photosensitive material, employing the coating, exposing, and develop process described for Example C-10. The dielectric layer was subsequently patterned by immersing the sample in etch bath E-2. Residual photosensitive material was removed from the sample in an acetone bath and an oxygen plasma treatment. The sample was coated with 1000 Angstroms of sputtered indium-tin-oxide. The ITO source, drain, and bussing structure was patterned using green-sensitive photosensitive material, employing the coating, exposing, develop, procedure described for Example C-5, etched in E-1, rinsed, and dried. Residual photosensitive material was removed from the sample in an acetone bath and an oxygen plasma treatment.

The zinc oxide semiconductor material was patterned using a blue-sensitive photocrosslinkable material in a selective deposition process. The same coating, exposing, develop, and ZnO deposition process was used as was described for Example 9. Devices were then tested for transistor activity. The transistors were well isolated, indicating that the selective deposition process employed was effective.

Accordingly, patterned thin films were produced, according to the present invention, that function as a deposition inhibitor material and are directly photopatterned using a multicolor mask. The fabrication sequence as outlined above allows for accurate placement of any number of transparent functional layers on the substrate even while exposing the substrate to varying temperature and solvent treatments. Further, compared to etch and liftoff patterning processes, the selective area deposition processes are particularly attractive for building structured materials because they eliminate the need for an etch step, reduce the number of cleaning steps required, and may even be used to pattern materials that are difficult to etch. Even for large area substrates, there are no issues with dimensional distortion of the substrate or mechanical alignment errors leading to cumulative and catastrophic alignment errors. Use of the multicolor mask and visible light curable films provides a unique solution to the registration challenge without the need for expensive alignment equipment and processes.

The invention claimed is:

1. A process for forming a structure comprising:
   a) providing a transparent support;
   b) forming a color mask, having a color pattern, on a first side of the transparent support;
   c) applying a first layer comprising a deposition inhibitor material that is sensitive to visible light either on the first side or a side opposite the first side of the transparent support after forming the color mask;
   d) patterning the first layer comprising the deposition inhibitor material by exposing the first layer through the color mask with visible light to form a first pattern, wherein the first pattern is composed of deposition inhibitor material in a second exposed state that is different from a first as-coated state, and developing the deposition inhibitor material to provide selected areas of the first layer effectively not having the deposition inhibitor material; and
   e) depositing a second layer of functional material over the transparent support;
   wherein the second layer of functional material is substantially deposited only in selected areas over the transparent support not having the deposition inhibitor material.

2. The process of claim 1 wherein the selected areas effectively not having the deposition inhibitor material correspond to the portion of the first pattern composed of the first as-coated state.

3. The process of claim 1 wherein the step of depositing the functional material comprises depositing an inorganic thin film over the transparent support by atomic layer deposition.

4. The process of claim 3 wherein the step of depositing the inorganic thin film comprises simultaneously directing a series of gas flows, wherein the series of gas flows comprises, in order, at least a first reactive gaseous material, an inert purge gas, and a second reactive gaseous material, optionally repeated a plurality of times, wherein the first reactive gaseous material is capable of reacting with a substrate surface treated with the second reactive gaseous material to form the inorganic thin film, wherein the first reactive gaseous material is a volatile organo-metallic precursor compound, wherein the process is carried out substantially at or above atmospheric pressure while the temperature of the substrate during deposition is under 300° C., and wherein the inorganic thin film is substantially deposited only in selected areas of the substrate surface effectively not having the deposition inhibitor material.

5. The process of claim 1 where in the deposition inhibitor material is applied to the first side of the transparent support, and wherein the color mask, support and the functional material in the selected areas remain in the structure.

6. The process of claim 1 further comprising removing the deposition inhibitor material after depositing the functional material.

7. The process of claim 1 wherein the color mask comprises at least two different color patterns and step (d) uses one of the colored patterns.

8. The process of claim 1 wherein the visible light used for exposing has a spectrum substantially contained within the absorbance spectrum of the color mask.

9. The process of claim 1 wherein the visible light used for exposing is white light and the deposition inhibitor material is sensitized to the light spectrum filtered by the color mask.

10. The process of claim 1 wherein the functional material is applied by additive printing process including gravure or inkjet.

11. The process of claim 1 wherein the deposition inhibitor comprises a photoinitiator and a polymeric material.

12. The process of claim 1 wherein the deposition inhibitor material comprises a multifunctional acrylate resin.

13. The process of claim 1 wherein the deposition inhibitor material has an inhibition power of at least 50 Å.

14. The process of claim 1 wherein the color mask having the color pattern is formed on the same side of the transparent support as that on which is applied the first layer comprising a deposition inhibitor and on which is deposited the second layer of functional material, wherein the layer of deposition inhibitor material is positive working or negative working.

15. The process of claim 1 wherein the color mask having the color pattern is formed on the opposite side of the transparent support from that on which is applied the first layer comprising a deposition inhibitor and from that on which is deposited the second layer of functional material, wherein the layer of deposition inhibitor material is positive working.

\* \* \* \* \*